(12) United States Patent
Nadal et al.

(10) Patent No.: US 11,189,488 B2
(45) Date of Patent: Nov. 30, 2021

(54) CORE-SHELL NANOPLATELETS AND USES THEREOF

(71) Applicant: NEXDOT, Romainville (FR)

(72) Inventors: Brice Nadal, Romainville (FR); Chloé Grazon, Romainville (FR); Wilfried Solo-Ojo, Romainville (FR)

(73) Assignee: NEXDOT, Romainville (FR)

( * ) Notice: Subject to any disclaimer, the term of this patent is extended or adjusted under 35 U.S.C. 154(b) by 350 days.

(21) Appl. No.: 16/087,802

(22) PCT Filed: Mar. 24, 2017

(86) PCT No.: PCT/EP2017/057126
§ 371 (c)(1),
(2) Date: Sep. 24, 2018

(87) PCT Pub. No.: WO2017/162878
PCT Pub. Date: Sep. 28, 2017

(65) Prior Publication Data
US 2019/0115212 A1    Apr. 18, 2019

Related U.S. Application Data

(60) Provisional application No. 62/312,777, filed on Mar. 24, 2016.

(30) Foreign Application Priority Data

Mar. 24, 2016   (EP) .................................. 16162423.4

(51) Int. Cl.
*H01L 21/02*      (2006.01)
*G02F 1/13357*    (2006.01)
(Continued)

(52) U.S. Cl.
CPC ........ *H01L 21/02601* (2013.01); *C09K 11/02* (2013.01); *C09K 11/565* (2013.01);
(Continued)

(58) Field of Classification Search
CPC ...... C09K 11/02; C09K 11/565; C09K 11/883
See application file for complete search history.

(56) References Cited

U.S. PATENT DOCUMENTS 9,506,627 B2 *   11/2016   Xu ............................. F21V 9/32
2010/0283072 A1 *   11/2010   Kazlas ................... G02B 6/005
257/98
(Continued)

FOREIGN PATENT DOCUMENTS

EP      2 395 569 A2      12/2011
JP    2007 146008 A       6/2007
(Continued)

OTHER PUBLICATIONS

International Search Report, dated May 31, 2017, from corresponding PCT/EP2017/057126 application.
(Continued)

*Primary Examiner* — C Melissa Koslow
(74) *Attorney, Agent, or Firm* — Nixon & Vanderhye

(57) ABSTRACT

Disclosed is a formulation of semiconductor nanoplatelets, including at least one nanoplatelet including a nanoplatelet core and a shell on the surface of the nanoplatelet core, wherein the formulation is substantially free of molecular oxygen and/or molecular water, and uses thereof.

12 Claims, 8 Drawing Sheets

(51) Int. Cl.
*C09K 11/88* (2006.01)
*C09K 11/02* (2006.01)
*C09K 11/56* (2006.01)
*H01L 33/00* (2010.01)
*G02F 1/1335* (2006.01)

(52) U.S. Cl.
CPC ...... *C09K 11/883* (2013.01); *G02F 1/133603* (2013.01); *G02F 1/133606* (2013.01); *H01L 21/0256* (2013.01); *H01L 21/02557* (2013.01); *H01L 21/02562* (2013.01); *H01L 33/00* (2013.01); *G02F 1/133614* (2021.01); *G02F 2202/36* (2013.01); *H01L 21/02628* (2013.01)

(56) References Cited

U.S. PATENT DOCUMENTS

| | | |
|---|---|---|
| 2014/0367721 A1 | 12/2014 | Mahler et al. |
| 2015/0331165 A1* | 11/2015 | Ryu .................. G02B 1/04 362/610 |

FOREIGN PATENT DOCUMENTS

| | | |
|---|---|---|
| WO | 2011/092646 A2 | 8/2011 |
| WO | 2012/099332 A2 | 7/2012 |
| WO | WO 2013/078247  * | 5/2013 |
| WO | 2014/064620 A1 | 5/2014 |
| WO | 2015/138174 A1 | 9/2015 |
| WO | 2016/016134 A1 | 2/2016 |

OTHER PUBLICATIONS

Pedetti, S. et al. "Type-II CdSe/CdTe core/crown semiconductor nanoplatelets", Journal of the American Chemical Society, vol. 136, No. 46, Nov. 19, 2014, p. 16430-16438.

Tessier, M.D. et al., "Efficient exciton concentrators built from colloidal core/crown CdSe/CdS semiconductor nanoplatelets", Nano Letters, vol. 14, No. 1, Aug. 1, 2014, pp. 207-213.

* cited by examiner

CORE-SHELL NANOPLATELETS AND USES THEREOF

FIELD OF INVENTION

The present invention relates to the field of nanoparticles and especially semiconductor nanocrystals. In particular, the present invention relates to nanoplatelets, populations of nanoplatelets, formulation and film comprising said nanoplatelets and uses thereof.

BACKGROUND OF INVENTION

To represent the colors in all their variety, one proceeds typically by additive synthesis of at least three complementary colors, especially red, green and blue. In a chromaticity diagram, the subset of available colors obtained by mixing different proportions of these three colors is formed by the triangle formed by the three coordinates associated with the three colors red green and blue. This subset constitutes what is called a gamut.

The majority of color display devices operate on this three-color principle: each pixel consists of three sub-pixels, one red, one green and one blue, whose mixture with different intensities can reproduce a colorful impression.

A luminescent or backlit display such as a computer LCD screen has to present the widest possible gamut for an accurate color reproduction. For this, the composing sub-pixels must be of the most saturated colors possible in order to describe the widest possible gamut. A light source has a saturated color if it is close to a monochromatic color. From a spectral point of view, this means that the light emitted by the source is comprised of a single narrow fluorescence band of wavelengths. A highly saturated shade has a vivid, intense color while a less saturated shade appears rather bland and gray.

It is therefore important to have light sources whose emission spectra are narrow and with saturated colors.

For example, in the case of a color display, the red, green and blue sub-pixels composing it must have a spectrum maximizing the gamut of the display system, and amounts exhibiting the narrowest possible emission from a spectral point of view.

Semiconductor nanoparticles, commonly called "quantum dots", are known as emissive material. Said objects have a narrow fluorescence spectrum, approximately 30 nm full width at half maximum, and offer the possibility to emit in the entire visible spectrum as well as in the infrared with a single excitation source in the ultraviolet. They are currently used in display devices as phosphors.

However, there is a real need for materials to be used in display devices and lighting devices, these materials having a high stability, especially a high stability to high photon flux. In addition, there is a need for materials having a high stability for long term use when deposited on diodes.

It is known to disperse semiconductor nanoparticles in a host material. For example, WO 2011/092646 discloses conversion layers comprising semiconductor nanoparticles and a host material, said host material being a polymer, an epoxy, silicone, glass, or a hybrid of silicone and epoxy. WO 2014/064620 discloses a light converter comprising a siloxane polymer matrix and quantum dots, wherein said quantum dots are spherical quantum dots or dot-in-rod quantum dots, and the siloxane polymer has the formula: $[(R_1,R_2)SiO]_n$, wherein R is a group such as hydrogen, hydrocarbon or fluorocarbon. WO 2015/138174 discloses composite particles comprising semiconductor core-shell nanoparticles and a thiol-substituted silicone ligand. JP 2007-146008 discloses core-shell particles, comprising an insulator core and a semiconductor shell, dispersed in a resin. WO 2016/016134 discloses quantum dots coated with an oxide layer, wherein said quantum dots are spherical core-shell quantum dots or dot-in-rod quantum dots. The coating process is performed in reverse micelles comprising a surfactant, a solvent, a base (ammonia) and water, and the oxide layer growth takes place within the water droplets formed during said process. Such systems do not prevent deteriorating species, such as molecular water or molecular oxygen, from attacking said nanoparticles. Indeed, the disclosed formulations and processes used to obtain said formulations comprise molecular water or molecular oxygen. However, protecting efficiently the nanoparticles surface, such as preventing oxidation, is needed to enable the long-term performance required of a product for display devices or lighting devices.

It is therefore an object of the present invention to provide nanoplatelets, nanoplatelets formulation and film and associated display and/or lighting devices exhibiting long-term high flux stability.

SUMMARY

One object of the invention is a formulation of semiconductor nanoplatelets comprising at least one nanoplatelet comprising a nanoplatelet core including a first semiconductor material and a shell including a second semiconductor material on the surface of the nanoplatelet core, wherein the nanoplatelets formulation is substantially free of molecular oxygen and/or molecular water.

In one embodiment, the nanoplatelets formulation exhibits fluorescence quantum efficiency decrease of less than 50% after at least 300 hours under light illumination with a photon flux of at least 10 $W \cdot cm^{-2}$.

Another object of the invention is a nanoplatelets film obtained from the formulation as described here above.

In one embodiment, the nanoplatelets formulation or film further comprises a host material.

In another embodiment, the nanoplatelets formulation or film further comprises scattering elements dispersed in the host material.

Another object of the invention is an encapsulated nanoplatelets film comprising the nanoplatelets film as described here above, optionally at least one auxiliary layer, and at least one protective layer.

In one embodiment, the encapsulated nanoplatelets film as described here above is in the form of a tube, vessel or capillary.

In another embodiment, the encapsulated nanoplatelets film as described here is in the form of a film.

Another object of the invention is an encapsulated nanoplatelets light emitting device comprising the encapsulated nanoplatelets film as described here above and a LED.

Another object of the invention is a lighting device comprising the encapsulated nanoplatelets light emitting device as described here above.

Another object of the invention is a backlight unit comprising the encapsulated nanoplatelets film as described here above, at least one light source and a light guide plate.

Another object of the invention is a backlight unit comprising the encapsulated nanoplatelets light emitting device as described here above and a light guide plate.

Another object of the invention is a backlight unit comprising the encapsulated nanoplatelets film as described here above, at least one light source and a diffuser plate.

Another object of the invention is a backlight unit comprising the encapsulated nanoplatelets light emitting device as described here above and a diffuser plate.

Another object of the invention is a liquid crystal display unit or a display unit comprising a backlight unit as described here above.

Definitions

In the present invention, the following terms have the following meanings:

As used herein the singular forms "a", "an", and "the" include plural reference unless the context clearly dictates otherwise.

The term "about" is used herein to mean approximately, roughly, around, or in the region of. When the term "about" is used in conjunction with a numerical range, it modifies that range by extending the boundaries above and below the numerical values set forth. In general, the term "about" is used herein to modify a numerical value above and below the stated value by a variance of 20 percent.

"Continuously emissive nanoplatelets" over a predetermined period refer to nanoplatelets which exhibit, under excitation, fluorescence (or photoluminescence) intensity above a threshold over the predetermined period. The integration time is set to allow sufficient excitation events of the nanoplatelets and is superior or equal to 1 ms. According to the present invention, during a measurement (see examples), said threshold may be set at three times the noise.

"Fluorescence quantum efficiency or quantum yield" refers to the ratio between the numbers of photons emitted by fluorescence divided by the number of absorbed photons.

"Display device" refers to a device that display an image signal. Display devices include all devices that display an image such as, non-limitatively, a television, a computer monitor, a personal digital assistant, a mobile phone, a laptop computer, a tablet PC, an MP3 player, a CD player, a DVD player, a head mounted display, a smart watch, a watch phone or a smart device.

"Monolayer" refers to a film or a continuous layer being of one atom thick.

"Nanoparticle or nanocrystal" refers to a particle of any shape having at least one dimension in the 0.1 to 100 nanometers range.

"Nanoplatelet", "nanosheet", "nanoplate" or "2D-nanoparticle" refers interchangeably to a nanoparticle having one dimension smaller than the two others; said dimension ranging from 0.1 to 100 nanometers. In the sense of the present invention, the smallest dimension (hereafter referred to as the thickness) is smaller than the other two dimensions (hereafter referred to as the length and the width) by a factor of at least 1.5, 2, 2.5, 3, 3.5, 4.5 or 5.

"Shell" refers to a film or a layer of at least one atom thick covering the initial nanoplatelet on each face (i.e. on the entire surface except, if the growth process is performed on a substrate, on the surface in contact with said substrate).

"Light recycling element" refers to an optical element that recycles or reflects a portion of incident light. Illustrative light recycling element includes reflective polarizers, light polarizing film, prism film, micro-structured films, metallic layers, multi-layer optical film.

"Scattering element" refers to an optical element that diffuses, spreads out or scatters light. Illustrative scattering element includes light scattering film, surface structuration, particulate-filled composite and combinations thereof.

"Formulation" refers to a solution, a liquid mixture comprising at least one chemical specie such as but not limited to: solvents, organic molecules, inorganic molecules, organic crystals, inorganic crystals, ions and/or gas.

"Free of oxygen" refers to a formulation, a solution, a film, or a composition that is free of molecular oxygen, $O_2$, i.e. wherein molecular oxygen may be present in said formulation, solution, film, or composition in an amount of less than about 10 ppm, 5 ppm, 4 ppm, 3 ppm, 2 ppm, 1 ppm, 500 ppb, 300 ppb or in an amount of less than about 100 ppb.

"Free of water" refers to a formulation, a solution, a film, or a composition that is free of molecular water, $H_2O$, i.e. wherein molecular water may be present in said formulation, solution, film, or composition in an amount of less than about 100 ppm, 50 ppm, 10 ppm, 5 ppm, 4 ppm, 3 ppm, 2 ppm, or in an amount of less than 1 ppm.

"Pixel pitch" refers to the distance from the center of a pixel to the center of the next pixel.

DETAILED DESCRIPTION

This invention relates to a nanoplatelet comprising an initial nanoplatelet core and a shell, a population of nanoplatelets comprising an initial nanoplatelet core and a shell and a nanoplatelets formulation or film comprising the population thereof.

According to one embodiment, the nanoplatelet of the invention comprises an initial nanoplatelet core and a shell covering the initial nanoplatelet, wherein the nanoplatelet is substantially free of molecular oxygen and/or molecular water.

According to one embodiment, the population of nanoplatelets of the invention comprises at least one nanoplatelet comprising an initial nanoplatelet core and a shell covering the initial nanoplatelet, wherein the nanoplatelet is substantially free of molecular oxygen and/or molecular water.

According to one embodiment, the nanoplatelets formulation or film of the invention comprises a population of nanoplatelets as described here above.

According to one embodiment, the nanoplatelets formulation or film of the invention comprises less than 1 ppm molecular oxygen and/or less than 1 ppm molecular water.

According to one embodiment, molecular oxygen may be present in a volume of the nanoplatelets formulation or film in an amount of less than about 10 parts per million (ppm), 5 ppm, 4 ppm, 3 ppm, 2 ppm, 1 ppm, 500 parts per billion (ppb), 300 ppb or less than about 100 ppb. According to one embodiment, molecular water may be present in a volume of the nanoplatelets formulation or film in an amount of less than about 100 ppm, 50 ppm, 10 ppm, 5 ppm, 4 ppm, 3 ppm, 2 ppm, or less than about 1 ppm.

According to one embodiment, molecular oxygen may be present in a volume of one or more components of the nanoplatelets formulation or film in an amount of less than about 10 ppm 5 ppm, 4 ppm, 3 ppm, 2 ppm, 1 ppm, 500 ppb, 300 ppb or in an amount of less than about 100 ppb. According to one embodiment, molecular water may be present in a volume of one or more components of the nanoplatelets formulation or film in an amount of less than about 100 ppm, 50 ppm, 10 ppm, 5 ppm, 4 ppm, 3 ppm, 2 ppm, or in an amount of less than 1 ppm.

According to one embodiment, the one or more components of the nanoplatelets formulation or film can include a polymerizable component, a crosslinking agent, a scattering agent, a rheology modifier, a filler, a photoinitiator, or a thermal initiator as described here after.

According to one embodiment, the nanoplatelets formulation or film substantially free of molecular oxygen and, optionally, substantially free of molecular water is provided by a combination of nanoplatelets substantially free of molecular oxygen and, optionally, substantially free of molecular water and one or more components of the nanoplatelets formulation or film substantially free of molecular oxygen and, optionally, substantially free of molecular water. In one embodiment, molecular oxygen may be present in the nanoplatelets film or formulation in an amount of less than about 10 ppm, 5 ppm, 4 ppm, 3 ppm, 2 ppm, 1 ppm, 500 ppb, 300 ppb or in an amount of less than about 100 ppb. In one embodiment, molecular water may be present in the nanoplatelets formulation or film in an amount of less than about 100 ppm, 50 ppm, 10 ppm, 5 ppm, 4 ppm, 3 ppm, 2 ppm, or in an amount of less than 1 ppm.

According to one embodiment, the nanoplatelet of the invention comprises an initial nanoplatelet core and a shell covering the initial nanoplatelet, wherein less than 50%, 40%, 30%, 25%, 20%, 15%, 10%, 5%, 4%, 3%, 2%, 1% of the surface of the shell is covered by an oxide layer.

According to one embodiment, the nanoplatelet of the invention comprises an initial nanoplatelet core and a shell covering the initial nanoplatelet, wherein no amorphous oxide layer is present at the surface of the shell.

According to one embodiment, the population of nanoplatelets of the invention comprises at least one nanoplatelet comprising an initial nanoplatelet core and a shell covering the initial nanoplatelet, wherein no oxide layer is present at the surface of the shell.

In one embodiment, the oxide layer is amorphous. In one embodiment, the shell of the nanoplatelet is not covered by an oxide layer.

According to one embodiment, the film or formulation of the invention comprises a population of nanoplatelets as described here above.

According to one embodiment, the initial nanoplatelet is an inorganic, colloidal, semiconductor and/or crystalline nanoplatelet.

According to one embodiment, the initial nanoplatelet has a thickness ranging from 0.3 nm to less than 500 nm, from 5 nm to less than 250 nm, from 0.3 nm to less than 100 nm, from 0.3 nm to less than 50 nm, from 0.3 nm to less than 25 nm, from 0.3 nm to less than 20 nm, from 0.3 nm to less than 15 nm, from 0.3 nm to less than 10 nm, or from 0.3 nm to less than 5 nm.

According to one embodiment, at least one of the lateral dimensions of the initial nanoplatelet is ranging from 2 nm to 1 m, from 2 nm to 100 mm, from 2 nm to 10 mm, from 2 nm to 1 mm, from 2 nm to 100 µm, from 2 nm to 10 µm, from 2 nm to 1 µm, from 2 nm to 100 nm, or from 2 nm to 10 nm.

According to one embodiment, the material composing the initial nanoplatelet comprises a material $M_xE_y$, wherein:
M is selected from Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb or a mixture thereof, E is selected from O, S, Se, Te, N, P, As, F, Cl, Br, I, or a mixture thereof; and
x and y are independently a decimal number from 0 to 5.

According to an embodiment, the material $M_xE_y$ comprises cationic element M and anionic element E in stoichiometric ratio, said stoichiometric ratio being characterized by values of x and y corresponding to absolute values of mean oxidation number of elements E and M respectively.

According to one embodiment, the faces substantially normal to the axis of the smallest dimension of the initial nanoplatelet consist either of M or E.

According to one embodiment, the smallest dimension of the initial nanoplatelet comprises an alternate of atomic layers of M and E.

According to one embodiment, the number of atomic layers of M in the initial nanoplatelet is equal to one plus the number of atomic layer of E.

According to an embodiment, the material composing the initial nanoplatelet comprises a material $M_xN_yE_z$, wherein:
M is selected from Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb or a mixture thereof;
N is selected from Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb or a mixture thereof;
E is selected from O, S, Se, Te, N, P, As, F, Cl, Br, I or a mixture thereof; and
x, y and z are independently a decimal number from 0 to 5, at the condition that when x is 0, y and z are not 0, when y is 0, x and z are not 0 and when z is 0, x and y are not 0.

According to one embodiment, the material composing the initial nanoplatelet comprises a material $M_xE_y$ wherein:
M is selected from group Ib, IIa, IIb, IIIa, IIIb, IVa, IVb, Va, Vb, VIb, VIIb, VIII or mixtures thereof;
E is selected from group Va, VIa, VIIa or mixtures thereof; and
x and y are independently a decimal number from 0 to 5.

According to one embodiment, the material composing the initial nanoplatelet comprises a semi-conductor from group IIb-VIa, group IVa-VIa, group Ib-IIIa-VIa, group IIb-IVa-Va, group Ib-VIa, group VIII-VIa, group IIb-Va, group IIIa-VIa, group IVb-VIa, group IIa-VIa, group IIIa-Va, group IIIa-VIa, group VIb-VIa, or group Va-VIa.

According to one embodiment, the material composing the initial nanoplatelet comprises at least one semiconductor chosen among CdS, CdSe, CdTe, CdO, $Cd_3P_2$, $Cd_3As_2$, ZnS, ZnSe, ZnO, ZnTe, $Zn_3P_2$, $Zn_3As2$, HgS, HgSe, HgTe, HgO, GeS, GeSe, GeTe, SnS, $SnS_2$, $SnSe_2$, SnSe, SnTe, PbS, PbSe, PbTe, $GeS_2$, $GeSe_2$, $CuInS_2$, $CuInSe_2$, CuS, $Cu_2S$, $Ag_2S$, $Ag_2Se$, $Ag_2Te$ $AgInS_2$, $AgInSe_2$, FeS, $FeS_2$, FeO, $Fe_2O_3$, $Fe_3O_4$, $Al_2O_3$, $TiO_2$, MgO, MgS, MgSe, MgTe, AlN, AlP, AlAs, AlSb, GaN, GaP, GaAs, GaSb, InN, InP, InAs, InSb, $In_2S_3$, TlN, TlP, TlAs, TlSb, $Bi_2S_3$, $Bi_2Se_3$, $Bi_2Te_3$, $MoS_2$, $WS_2$, $VO_2$ or a mixture thereof.

According to one embodiment, the initial nanoplatelet is selected from the group consisting of CdS, CdSe, CdSSe, CdTe, ZnS, ZnSe, ZnTe, PbS, PbSe, PbTe, $CuInS_2$, $CuInSe_2$, $AgInS_2$, $AgInSe_2$, CuS, $Cu_2S$, $Ag_2S$, $Ag_2Se$, $Ag_2Te$, FeS, $FeS_2$, PdS, $Pd_4S$, $WS_2$ or a mixture thereof.

According to one embodiment, the initial nanoplatelet comprises an alloy of the aforementioned materials.

According to one embodiment, the initial nanoplatelet comprises an additional element in minor quantities. The term "minor quantities" refers herein to quantities ranging from 0.0001% to 10% molar, preferably from 0.001% to 10% molar relative to the majority element of said initial nanoplatelet.

According to one embodiment, the initial nanoplatelet comprises a transition metal or a lanthanide in minor quantities. The term "minor quantities" refers herein to quantities ranging from 0.0001% to 10% molar, preferably from 0.001% to 10% molar relative to the majority element of said initial nanoplatelet.

According to one embodiment, the initial nanoplatelet comprises in minor quantities an element inducing an excess or a defect of electrons compared to the sole nanoplatelet. The term "minor quantities" refers herein to quantities ranging from 0.0001% to 10% molar, preferably from 0.001% to 10% molar relative to the majority element of said initial nanoplatelet.

According to one embodiment, the initial nanoplatelet comprises in minor quantities an element inducing a modification of the optical properties compared to the sole nanoplatelet. The term "minor quantities" refers herein to quantities ranging from 0.0001% to 10% molar, preferably from 0.001% to 10% molar relative to the majority element of said initial nanoplatelet.

According to one embodiment, the initial nanoplatelet consists of a core-shell nanoplatelet such as a core-shell nanoplatelet known by one skilled in the art or a core-shell nanoplatelet according to the present invention. According to one embodiment, the "core" nanoplatelets can have an overcoating or shell on the surface of its core.

According to a first embodiment, the final nanoplatelet is an inorganic, colloidal, semiconductor and/or crystalline nanoplatelet.

According to one embodiment, the final nanoplatelet (initial nanoplatelet+shell) has a thickness ranging from 0.5 nm to 10 mm, from 0.5 nm to 1 mm, from 0.5 nm to 100 µm, from 0.5 nm to 10 µm, from 0.5 nm to 1 µm, from 0.5 nm to 500 nm, from 0.5 nm to 250 nm, from 0.5 nm to 100 nm, from 0.5 nm to 50 nm, from 0.5 nm to 25 nm, from 0.5 nm to 20 nm, from 0.5 nm to 15 nm, from 0.5 nm to 10 nm or from 0.5 nm to 5 nm.

According to one embodiment, at least one of the lateral dimensions of the final nanoplatelet is ranging from 2 nm to 1 m, from 2 nm to 100 mm, from 2 nm to 10 mm, from 2 nm to 1 mm, from 2 nm to 100 µm, from 2 nm to 10 µm, from 2 nm to 1 µm, from 2 nm to 100 nm, or from 2 nm to 10 nm.

According to one embodiment, the thickness of the shell is ranging from 0.2 nm to 10 mm, from 0.2 nm to 1 mm, from 0.2 nm to 100 µm, from 0.2 nm to 10 µm, from 0.2 nm to 1 µm, from 0.2 nm to 500 nm, from 0.2 nm to 250 nm, from 0.2 nm to 100 nm, from 0.2 nm to 50 nm, from 0.2 nm to 25 nm, from 0.2 nm to 20 nm, from 0.2 nm to 15 nm, from 0.2 nm to 10 nm or from 0.2 nm to 5 nm.

According to one embodiment, the material composing the shell comprises a material $M_xE_y$, wherein:
M is selected from Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, or a mixture thereof,
E is selected from O, S, Se, Te, N, P, As, F, Cl, Br, I, or a mixture thereof,
and x and y are independently a decimal number from 0 to 5.

According to an embodiment, the material $M_xE_y$ comprises cationic element M and anionic element E in stoichiometric ratio, said stoichiometric ratio being characterized by values of x and y corresponding to absolute values of mean oxidation number of elements E and M respectively.

According to one embodiment, the faces substantially normal to the axis of the smallest dimension of the shell consist either of M or E.

According to one embodiment, the smallest dimension of the shell comprises an alternate of atomic layers of M and E.

According to one embodiment, the number of atomic layers of M in the shell is equal to one plus the number of atomic layer of E.

According to an embodiment, the material composing the shell comprises a material $M_xN_yE_z$, wherein:
M is selected from Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb or a mixture thereof;
N is selected from Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb or a mixture thereof;
E is selected from O, S, Se, Te, N, P, As, F, Cl, Br, I, or a mixture thereof; and
x, y and z are independently a decimal number from 0 to 5, at the condition that when x is 0, y and z are not 0, when y is 0, x and z are not 0 and when z is 0, x and y are not 0.

According to a preferred embodiment, the material composing the shell comprises a material $M_xE_y$ wherein:
M is selected from group Ib, IIa, IIb, IIIa, IIIb, IVa, IVb, Vb, VIb, VIIb, VIII or mixtures thereof;
E is selected from group Va, VIa, VIIa or mixtures thereof; and
x and y are independently a decimal number from 0 to 5.

According to one embodiment, the material composing the shell comprises a semi-conductor from group IIb-VIa, group IVa-VIa, group Ib-IIIa-VIa, group IIb-IVa-Va, group Ib-VIa, group VIII-VIa, group IIb-Va, group IIIa-VIa, group IVb-VIa, group IIa-VIa, group IIIa-Va, group IIIa-VIa, group VIb-VIa, or group Va-VIa.

According to one embodiment, the material composing the shell comprises at least one semiconductor chosen among CdS, CdSe, CdTe, CdO, $Cd_3P_2$, $Cd_3As_2$, ZnS, ZnSe, ZnO, ZnTe, $Zn_3P_2$, $Zn_3As_2$, CdZnS, HgS, HgSe, HgTe, HgO, GeS, GeSe, GeTe, SnS, $SnS_2$, $SnSe_2$, SnSe, SnTe, PbS, PbSe, PbTe, $GeS_2$, $GeSe_2$, $CuInS_2$, $CuInSe_2$, CuS, $Cu_2S$, $Ag_2S$, $Ag_2Se$, $Ag_2Te$, $AgInS_2$, $AgInSe_2$, FeS, $FeS_2$, FeO, $Fe_2O_3$, $Fe_3O_4$, $Al_2O_3$, $TiO_2$, MgO, MgS, MgSe, MgTe, AlN, AlP, AlAs, AlSb, GaN, GaP, GaAs, GaSb, InN, InP, InAs, InSb, $In_2S_3$, TlN, TlP, TlAs, TlSb, $Bi_2S_3$, $Bi_2Se_3$, $Bi_2Te_3$, $MoS_2$, PdS, $Pd_4S$, $WS_2$, $VO_2$ or a mixture thereof.

According to one embodiment, the shell comprises an alloy or a gradient of the aforementioned materials.

According to one embodiment the shell is an alloy or a gradient of the group consisting of CdS, CdSe, CdSSe, CdTe, ZnS, ZnSe, ZnTe, PbS, PbSe, PbTe, $CuInS_2$, $CuInSe_2$, $AgInS_2$, $AgInSe_2$, CuS, $Cu_2S$, $Ag_2S$, $Ag_2Se$, $Ag_2Te$, FeS, $FeS_2$, PdS, $Pd_4S$, $WS_2$ or a mixture thereof.

According to one embodiment, the shell is an alloy of $Cd_xZn_{1-x}S$ with x ranging from 0 to 1. According to one embodiment, the shell is a gradient of CdZnS.

According to a preferred embodiment, the final core-shell nanoplatelet is selected from the group consisting of CdSe/CdS; CdSe/CdZnS; CdSe/ZnS; CdSeTe/CdS; CdSeTe/CdZnS; CdSeTe/ZnS; CdSSe/CdS; CdSSe/CdZnS; CdSSe/ZnS.

According to a preferred embodiment, the final core-shell nanoplatelet is selected from the group consisting of CdSe/CdS/ZnS; CdSe/CdZnS/ZnS; CdSe/ZnS/CdZnS; CdSeTe/CdS/ZnS; CdSeTe/CdZnS/ZnS; CdSeTe/ZnS; CdSSe/CdS/ZnS; CdSSe/CdZnS/ZnS; CdSSe/ZnS.

According to one embodiment, the final nanoplatelet is homostructured, i.e. the initial nanoplatelet and the shell are composed of the same material.

In one embodiment, the final nanoplatelet is heterostructured, i.e. the initial nanoplatelet and the shell are composed of at least two different materials.

According to one embodiment, the final nanoplatelet comprises the initial nanoplatelet and a shell comprising 1, 2, 3, 4, 5, 6, 7, 8, 9, 10, 15, 20, 25, 50 or more monolayers covering all of the initial nanoplatelet. Said layers being of same composition as the initial nanoplatelet or being of different composition than the initial nanoplatelet or being of different composition one to another.

According to one embodiment, the final nanoplatelet comprises the initial nanoplatelet and a shell comprising at least 5, 6, 7, 8, 9, 10, 15, 20, 25, 50 or more monolayers covering all of the initial nanoplatelet. Said layers being of same composition as the initial nanoplatelet or being of different composition than the initial nanoplatelet or being of different composition one to another.

According to one embodiment, the faces substantially normal to the axis of the smallest dimension of the final nanoplatelet consist either of M or E.

According to one embodiment, the smallest dimension of the final nanoplatelet comprises an alternate of atomic layers of M and E.

According to one embodiment, the number of atomic layers of M in the final nanoplatelet is equal to one plus the number of atomic layer of E.

According to one embodiment, the shell comprises a substantially identical thickness on each facet on the initial nanoplatelet.

The present invention relates to a process of growth of a shell on initial colloidal nanoplatelets.

According to one embodiment, the initial nanoplatelet is obtained by any method known from one skilled in the art.

According to one embodiment, the process of growth of a shell comprises the growth of a homogeneous shell on each facet of the initial colloidal nanoplatelet.

According to one embodiment, the process of growth of core-shell nanoplatelets comprising a ME shell on initial colloidal nanoplatelets comprises the steps of injecting the initial colloidal nanoplatelets in a solvent at a temperature ranging from 200° C. to 460° C. and subsequently a precursor of E or M, wherein said precursor of E or M is injected slowly in order to control the shell growth rate; and wherein the precursor of respectively M or E is injected either in the solvent before injection of the initial colloidal nanoplatelets or in the mixture simultaneously with the precursor of respectively E or M.

According to one embodiment, the initial colloidal nanoplatelets are mixed with a fraction of the precursor's mixture before injection in the solvent.

According to one embodiment, the process of growth of a $M_xE_y$ shell on initial colloidal nanoplatelets comprises the steps of injecting the initial colloidal nanoplatelets in a solvent at a temperature ranging from 200° C. to 460° C. and subsequently a precursor of E or M, wherein said precursor of E or M is injected slowly in order to control the shell growth rate; and wherein the precursor of respectively M or E is injected either in the solvent before injection of the initial colloidal nanoplatelets or in the mixture simultaneously with the precursor of respectively E or M; wherein x and y are independently a decimal number from 0 to 5.

According to one embodiment, the process of growth of core-shell nanoplatelets comprising a ME shell on initial colloidal nanoplatelets comprises the following steps:
heating a solvent at a temperature ranging from 200° C. to 460° C.;
injecting in the solvent the initial colloidal nanoplatelets;
injecting slowly in the mixture the precursor of E and the precursor of M;
recovering the core-shell structure in the form of nanoplatelets.

According to another embodiment, the process of growth of core-shell nanoplatelets comprising a ME shell on initial colloidal nanoplatelets comprises the following steps:
heating a solvent at a temperature ranging from 200° C. to 460° C.;
injecting a precursor of M in the solvent;
injecting in the mixture the initial colloidal nanoplatelets;
injecting slowly in the mixture the precursor of E;
recovering the core-shell structure in the form of nanoplatelets.

According to another embodiment, the process of growth of core-shell nanoplatelets comprising a ME shell on initial colloidal nanoplatelets comprises the following steps:
heating a solvent at a temperature ranging from 200° C. to 460° C.;
injecting a precursor of E in the solvent;
injecting in the mixture the initial colloidal nanoplatelets;
injecting slowly in the mixture the precursor of M;
recovering the core-shell structure in the form of nanoplatelets.

According to another embodiment, the process of growth of core-shell nanoplatelets comprising a ME shell on initial colloidal nanoplatelets comprises the following steps:
heating a solvent at a temperature ranging from 200° C. to 460° C.;
injecting in the solvent the initial colloidal nanoplatelets, optionally mixed with a fraction of the precursors mixture;
injecting slowly in the mixture the precursor of E and the precursor of M;
recovering the core-shell structure in the form of nanoplatelets.

Herein the term "fraction of the precursors mixture" refers to a part of the total amount of precursors used in the reaction, i.e. from 0.001% to 50%, preferably from 0.001% to 25%, more preferably from 0.01% to 10% of the total amount of the injected precursors mixture.

According to another embodiment, the process of growth of core-shell nanoplatelets comprising a ME shell on initial colloidal nanoplatelets comprises the following steps:
providing a solvent and a precursor of M;
heating the mixture of the solvent and the precursor of M at a temperature ranging from 200° C. to 460° C.;
injecting in the mixture the initial colloidal nanoplatelets;
injecting slowly in the mixture the precursor of E;
recovering the core-shell structure in the form of nanoplatelets.

According to another embodiment, the process of growth of core-shell nanoplatelets comprising a ME shell on initial colloidal nanoplatelets comprises the following steps:
providing a solvent and a precursor of E;
heating the mixture of the solvent and the precursor of E at a temperature ranging from 200° C. to 460° C.;
injecting in the mixture the initial colloidal nanoplatelets;
injecting slowly in the mixture the precursor of M;

recovering the core-shell structure in the form of nanoplatelets.

According to one embodiment, the initial colloidal nanoplatelets have a core-shell structure.

According to another embodiment, the process of growth of core-shell nanoplatelets comprising a ME shell on initial colloidal nanoplatelets further comprises at least one of the following steps:
- adding in minor quantities a precursor of an additional element;
- adding in minor quantities a precursor of a transition metal or a lanthanide;
- adding in minor quantities a precursor of an element inducing an excess or a defect of electrons compared to the sole nanoplatelet;
- adding in minor quantities a precursor of an element inducing a modification of the optical properties compared to the sole nanoplatelet.

The term "minor quantities" refers herein to quantities ranging from 0.0001% to 10% molar, preferably from 0.001% to 10% molar relative to the majority element of said initial nanoplatelet.

According to one embodiment, the process of growth of core-shell nanoplatelets comprising a ME shell on initial colloidal nanoplatelets further comprises a step of annealing, i.e. maintaining the mixture at a temperature ranging from 200° C. to 460° C. during a predetermined duration ranging from 5 to 180 minutes after the end of the injection of the second precursor.

According to one embodiment, the temperature of the annealing step ranges from 200° C. and 460° C., from 275° C. to 365° C., from 300° C. to 350° C. or about 300° C.

According to one embodiment, the duration of the annealing step ranges from 1 to 180 minutes, from 30 to 120 minutes, from 60 to 120 minutes or about 90 minutes.

According to one embodiment, the initial colloidal nanoplatelets are injected over a period of less than 10 minutes, less than 5 minutes, less than 1 minute, less than 30 seconds, less than 10 seconds, less than 5 seconds or less than 1 second. According to one embodiment, the initial colloidal nanoplatelets are injected at once.

According to one embodiment, the initial colloidal nanoplatelets are injected at a rate ranging from 1 mL/s to 1 Us, from 1 mL/s to 100 mL/s, from 1 mL/s to 10 mL/s, from 2 to 8 mL/s or about 5 mL/s.

According to one embodiment, the injection of the precursor of E or the precursor of M of the shell is performed at a rate ranging from 0.1 to 30 mole/h/mole of M present in the initial nanoplatelet, preferably from 0.2 to 20 mole/h/mole of M present in the initial nanoplatelet, more preferably from 1 to 21 mole/h/mole of M present in the initial nanoplatelets.

According to one embodiment, the precursor of E or the precursor of M is injected slowly i.e. over a period ranging from 1 minutes to 2 hours, from 1 minute to 1 hour, from 5 to 30 minutes or from 10 to 20 minutes for each monolayer.

According to one embodiment, the precursor of E is injected slowly, i.e. at a rate ranging from 0.1 mL/h to 10 Uh, from 0.5 mL/h to 5 Uh or from 1 mL/h to 1 Uh.

According to one embodiment, the precursor of M is injected slowly, i.e. at a rate ranging from 0.1 mL/h to 10 Uh, from 0.5 mL/h to 5 Uh or from 1 mL/h to 1 Uh.

According to one embodiment, the precursor of E and the precursor of M are injected slowly in order to control the shell growth rate.

According to one embodiment wherein the precursor of M or the precursor of E is injected prior to the initial colloidal nanoplatelets, said precursor of M or said precursor of E is injected over a period of less than 30 seconds, less than 10 seconds, less than 5 seconds, less than 1 second. According to another embodiment wherein the precursor of M or the precursor of E is injected prior to the initial colloidal nanoplatelets, said precursor of M or said precursor of E is injected slowly, i.e. at a rate ranging from 0.1 mL/h to 10 L/h, from 0.5 mL/h to 5 L/h or from 1 mL/h to 1 L/h.

According to one embodiment, the precursor of M or the precursor of E injected prior to the initial colloidal nanoplatelets is injected faster than the precursor of M or the precursor of E injected after the initial colloidal nanoplatelets.

According to one embodiment, the injection's rate of at least one of the precursor of E and/or the precursor of M is chosen such that the growth rate of the shell is ranging from 1 nm per second to 0.1 nm per hour.

According to one embodiment, the growth process is performed at temperature ranging from 200° C. to 460° C., from 275° C. to 365° C., from 300° C. to 350° C. or about 300° C.

According to one embodiment, the reaction is performed under an inert atmosphere, preferably nitrogen or argon atmosphere.

According to one embodiment, the precursor of E is capable of reacting with the precursor of M to form a material with the general formula ME.

According to one embodiment, the precursor of the shell to be deposited is a precursor of a material $M_xE_y$, wherein:
M is Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, or a mixture thereof,
E is O, S, Se, Te, N, P, As, F, Cl, Br, I, or a mixture thereof, and x and y are independently a decimal number from 0 to 5.

According to an embodiment, the precursor of the shell to be deposited is a material $M_xE_y$ comprising cationic element M and anionic element E in stoichiometric ratio, said stoichiometric ratio being characterized by values of x and y corresponding to absolute values of mean oxidation number of elements E and M respectively.

According to a preferred embodiment, the precursor of the shell to be deposited is a precursor of a material $M_xE_y$ wherein:
M is selected from group Ib, IIa, IIb, IIIa, IIIb, IVa, IVb, Vb, VIb, VIIb, VIII or mixtures thereof;
E is selected from group Va, VIa, VIIa or mixtures thereof; and
x and y are independently a decimal number from 0 to 5.

According to one embodiment, the precursor of the shell to be deposited is a precursor of a compound of group IIb-VIa, group IVa-VIa, group Ib-IIIa-VIa, group IIb-IVa-Va, group Ib-VIa, group VIII-VIa, group IIb-Va, group IIIa-VIa, group IVb-VIa, group IIa-VIa, group IIIa-Va, group IIIa-VIa, group VIb-VIa, or group Va-VIa.

According to one embodiment, the precursor of the shell to be deposited is a precursor of a material chosen among CdS, CdSe, CdTe, CdO, $Cd_3P_2$, $Cd_3As_2$, ZnS, ZnSe, ZnO, ZnTe, $Zn_3P_2$, $Zn_3As_2$, HgS, HgSe, HgTe, HgO, GeS, GeSe, GeTe, SnS, $SnS_2$, $SnSe_2$, SnSe, SnTe, PbS, PbSe, PbTe, $GeS_2$, $GeSe_2$, $CuInS_2$, $CuInSe_2$, CuS, $Cu_2S$, $Ag_2S$, $Ag_2Se$, $Ag_2Te$ $AgInS_2$, $AgInSe_2$, FeS, $FeS_2$, FeO, $Fe_2O_3$, $Fe_3O_4$, $Al_2O_3$, $TiO_2$, MgO, MgS, MgSe, MgTe, AlN, AlP, AlAs, AlSb, GaN, GaP, GaAs, GaSb, InN, InP, InAs, InSb, $In_2S_3$, TlN, TlP, TlAs, TlSb, $Bi_2S_3$, $Bi_2Se_3$, $Bi_2Te_3$, $MoS_2$, $WS_2$, $VO_2$ or a mixture thereof.

According to a preferred embodiment, the precursor of the shell to be deposited is a precursor of a material selected from the group consisting of CdS, CdSe, CdSSe, CdTe, ZnO, ZnS, ZnSe, ZnTe, PbS, PbSe, PbTe, $CuInS_2$, $CuInSe_2$, $AgInS_2$, $AgInSe_2$, CuS, $Cu_2S$, $Ag_2S$, $Ag_2Se$, $Ag_2Te$, FeS, $FeS_2$, PdS, $Pd_4S$, $WS_2$ or a mixture thereof.

According to one embodiment, if E is a chalcogenide, the precursor of E is a compound containing the chalcogenide at the −2 oxidation state. According to one embodiment, if E is a chalcogenide, the precursor of E is formed in situ by reaction of a reducing agent with a compound containing E at the 0 oxidation state or at a strictly positive oxidation state.

According to one embodiment, if E is sulfur, the precursor of E is a thiol. According to one embodiment, if E is sulfur, the precursor of E is propanethiol, buanethiol, pentanethiol, hexanethiol, heptanethiol, octanethiol, decanethiol, dodecanethiol, tetradecanethiol or hexadecanethiol. According to one embodiment, if E is sulfur, the precursor of E is a salt containing $S^{2−}$ sulfide ions. According to one embodiment, if E is sulfur, the precursor of E comprises bis(trimethylsilyl) sulfide ($TMS_2S$) or hydrogen sulfide ($H_2S$) or sodium hydrogen sulfide (NaSH) or sodium sulfide ($Na_2S$) or ammonium sulfide ($S(NH_4)_2$) or thiourea or thioacetamide. According to one embodiment, if E is sulfur, the precursor of E is sulfur dissolved in a suitable solvent. According to one embodiment, if E is sulfur, the precursor of E is sulfur dissolved in 1-octadecene. According to one embodiment, if E is sulfur, the precursor of E is sulfur dissolved in a phosphine. According to one embodiment, if E is sulfur, the precursor of E is sulfur dissolved in trioctylphosphine or tributylphosphine. According to one embodiment, if E is sulfur, the precursor of E is sulfur dissolved in an amine. According to one embodiment, if E is sulfur, the precursor of E is sulfur dissolved in oleylamine. According to one embodiment, if E is sulfur, the precursor of E is sulfur powder dispersed in a solvent. According to one embodiment, if E is sulfur, the precursor of E is sulfur powder dispersed in 1-octadecene. According to one embodiment, if E is selenium; the precursor of E comprises a salt containing $Se^{2−}$ selenide ions. According to one embodiment, the precursor of E comprises bis(trimethylsilyl) selenide ($TMS_2Se$) or hydrogen selenide ($H_2Se$) or sodium selenide ($Na_2Se$) or sodium hydrogen selenide (NaSeH) or sodium selenosulfate ($Na_2SeSO_3$) or selenourea. According to one embodiment, if E is selenium, the precursor of E is a selenol. According to one embodiment, if E is selenium, the precursor of E is a diselenide, such as Diphenyl diselenide. According to one embodiment, if E is selenium, the precursor of E is selenium dissolved in a suitable solvent. According to one embodiment, if E is selenium, the precursor of E is selenium dissolved in 1-octadecene. According to one embodiment, if E is selenium, the precursor of E is selenium dissolved in a phosphine. According to one embodiment, if E is selenium, the precursor of E is selenium dissolved in trioctylphosphine or tributylphosphine. According to one embodiment, if E is selenium, the precursor of E is selenium dissolved in an amine. According to one embodiment, if E is selenium, the precursor of E is selenium dissolved in an amine and thiol mixture. According to one embodiment, if E is selenium, the precursor of E is selenium powder dispersed in a solvent. According to one embodiment, if E is selenium, the precursor of E is selenium powder dispersed in 1-octadecene.

According to one embodiment, if E is tellurium, the precursor of E is as salt containing $Te^{2−}$ telluride ions. According to one embodiment, if E is tellurium, the precursor of E comprises bis(trimethylsilyl) telluride ($TMS_2Te$) or hydrogen telluride ($H_2Te$) or sodium telluride ($Na_2Te$) or sodium hydrogen telluride (NaTeH) or sodium tellurosulfate ($Na_2TeSO_3$) or tellurourea. According to one embodiment, if E is tellurium, the precursor of E is tellurium dissolved in a suitable solvent. According to one embodiment, if E is tellurium, the precursor of E is tellurium dissolved a phosphine. According to one embodiment, if E is tellurium, the precursor of E is tellurium dissolved in trioctylphosphine or tributylphosphine.

According to one embodiment, if E is oxygen, the precursor of E is the hydroxide ion ($HO^−$). According to one embodiment, if E is oxygen the precursor of E is a solution of sodium hydroxide (NaOH) or of potassium hydroxide (KOH) or of tetramethylammonium hydroxide (TMAOH). According to one embodiment, if E is oxygen, the precursor of E is generated in-situ by condensation between an amine and a carboxylic acid. According to one embodiment, if E is oxygen, the precursor of E is generated in-situ by condensation of two carboxylic acids.

According to one embodiment, if E is phosphorus, the precursor of E comprises phosphorus at the −3 oxidation state. According to one embodiment, the precursor of E comprises tris(trimethylsilyl) phosphine ($TMS_3P$) or phosphine ($PH_3$) or white phosphorus ($P_4$) or phosphorus trichloride ($PCl_3$). According to one embodiment, the precursor of E comprises a tris(dialkylamino)phosphine for example tris (dimethylamino)phosphine (($Me_2N)_3P$) or tris(diethylamino)phosphine (($Et_2N)_3P$). According to one embodiment, the precursor of E comprises a trialkylphosphine for example trioctylphosphine or tributylphosphine or triphenylphosphine.

According to one embodiment, if M is a metal, the precursor of M is a compound containing the metal at positive or 0 oxidation state. According to one embodiment, if M is a metal, the precursor of M comprises a metallic salt. In one embodiment, the metallic salt is a carboxylate of M, or a chloride of M, or a bromide of M, or a iodide of M, or a nitrate of M, or a sulfate of M, or a thiolate of M. According to one embodiment, the shell comprises a metal.

According to one embodiment, the shell to be deposited comprises a chalcogenide, a phosphide, a nitride, an arsenide or an oxide.

According to one embodiment, the initial nanosheet is dispersed in a solvent. According to one embodiment, the solvent is organic, preferably apolar or weakly polar. According to one embodiment, the solvent is a supercritical fluid or an ionic fluid. According to one embodiment, the solvent is selected from distilled water, methanol, ethanol, isopropanol, butanol, chloroform, acetone, hexane, tetrahydrofuran, dimethylsulfoxide, toluene, octadecene, squalane, trioctylamine, oleylamine, hexadecylamine, octadecylamine, squalene, and/or dimethylformamide.

According to one embodiment, the shell comprises an additional element in minor quantities. The term "minor quantities" refers herein to quantities ranging from 0.0001% to 10% molar, preferably from 0.001% to 10% molar relative to the majority element of said shell.

According to one embodiment, the shell comprises a transition metal or a lanthanide in minor quantities. The term "minor quantities" refers herein to quantities ranging from 0.0001% to 10% molar, preferably from 0.001% to 10% molar relative to the majority element of said shell.

According to one embodiment, the shell comprises in minor quantities an element inducing an excess or a defect of electrons compared to the sole film. The term "minor quantities" refers herein to quantities ranging from 0.0001% to 10% molar, preferably from 0.001% to 10% molar relative to the majority element of said shell.

According to one embodiment, a reducing agent is introduced at the same time as at least one of the precursor of M and/or E. In one embodiment, the reducing agent comprises a hydride. Said hydride may be selected from sodium tetrahydroborate ($NaBH_4$); sodium hydride (NaH), lithium tetrahydroaluminate ($LiAlH_4$), diisobutylaluminum hydride (DIBALH). In one embodiment, the reducing agent comprises dihydrogen.

According to one embodiment, a stabilizing compound capable of stabilizing the final nanoplatelet is introduced in the solvent.

According to one embodiment, a stabilizing compound capable of stabilizing the final nanoplatelet is introduced in anyone of the precursor solutions.

According to one embodiment, the stabilizing compound of the final nanoplatelet comprises an organic ligand. Said organic ligand may comprise a carboxylic acid, a thiol, an amine, a phosphine, a phosphine oxide, a phosphonic acid, a phosphinic acid, an amide, an ester, a pyridine, an imidazole and/or an alcohol.

According to one embodiment, the stabilizing compound of the final nanoplatelet is an ion. Said ion comprises a quaternary ammonium.

According to one embodiment, the initial nanosheet is fixed on a least one substrate.

According to one embodiment, the fixation of the initial nanosheet on said substrate is performed by adsorption or chemical coupling.

According to one embodiment, said substrate is chosen among silica $SiO_2$, aluminum oxide $Al_2O_3$, indium-tin oxide ITO, fluorine-doped tin oxide FTO, titanium oxide $TiO_2$, gold, silver, nickel, molybdenum, aluminum, silicium, germanium, silicon carbide SiC, graphene and cellulose.

According to one embodiment, said substrate comprises a polymer.

According to one embodiment, the excess of precursors is discarded after the reaction.

According to one embodiment, the final nanoplatelet obtained after reaction of the precursors on the initial nanosheets is purified. Said purification is performed by flocculation and/or precipitation and/or filtration; such as for example successive precipitation in ethanol.

The present invention also relates to a population of semiconductor nanoplatelets, each member of the population comprising a nanoplatelet core including a first semiconductor material and at least one shell including a second semiconductor material on the surface of the nanoplatelet core, wherein after ligand exchange reaction the population exhibits a quantum yield decrease of less than 50%.

According to one embodiment, the population of semiconductor nanoplatelets of the present invention exhibit, after ligand exchange, a quantum yield decrease of less than 50%, less than 40%, less than 30%, less than 25%, less than 20%, less than 15% or less than 10%, less than 5%.

Especially, according to one embodiment, after transfer into an aqueous solution by ligand exchange reaction, the quantum yield of the population of nanoplatelets according to the present invention decrease of less than 50%, less than 40%, less than 30%, less than 25%, less than 20%, less than 15% or less than 10%, less than 5%.

According to one embodiment, the ligand is an organic ligand with a carbonated chain length between 1 and 30 carbons.

According to one embodiment, the ligand is a polymer.

According to one embodiment, the selected ligand may comprise a carboxylic acid, a thiol, an amine, a phosphine, a phosphine oxide, a phosphonic acid, a phosphinic acid, an amide, an ester, a pyridine, an imidazole and/or an alcohol.

According to one embodiment, the ligand is selected from myristic acid, stearic acid, palmitic acid, oleic acid, behenic acid, dodecanethiol, oleylamine, 3-mercaptopropionic acid.

According to one embodiment, the selected ligand may be any number of materials, but has an affinity for the semiconductor surface. In general, the ligand can be an isolated organic molecule, a polymer (or a monomer for a polymerization reaction), an inorganic complex, and an extended crystalline structure.

According to one embodiment, the ligand exchange procedure comprises the step of treating a solution of nanoplatelets according to the invention with a ligand.

According to one embodiment, the formation of an amorphous oxide layer at the surface of the shell is prevented by avoiding any contact of the population of nanoplatelets with molecular oxygen and/or molecular water.

According to one embodiment, the contact between the population of nanoplatelets and molecular oxygen and/or molecular water is prevented during the synthesis.

According to one embodiment, the contact between the population of nanoplatelets and molecular oxygen and/or molecular water is prevented during the washing.

According to one embodiment, the contact between the population of nanoplatelets and molecular oxygen and/or molecular water is prevented during storage.

According to one embodiment, the contact between the population of nanoplatelets and molecular oxygen and/or molecular water is prevented during ligand exchange.

According to one embodiment, the contact between the population of nanoplatelets and molecular oxygen and/or molecular water is prevented during the synthesis, the washing, the storage and/or the ligand exchange.

According to one embodiment, the population of nanoplatelets of the present invention has been synthesized under a molecular oxygen and molecular water free conditions.

According to one embodiment, the population of nanoplatelets of the present invention has been washed under a molecular oxygen and molecular water free conditions.

According to one embodiment, the population of nanoplatelets of the present invention has been stored under a molecular oxygen and molecular water free conditions.

According to one embodiment, the population of nanoplatelets of the present invention has been synthesized, washed and stored under a molecular oxygen and molecular water free conditions.

The inert oxygen and water free conditions can be provided by an argon atmosphere, a nitrogen atmosphere or other inert gas atmosphere.

The inert oxygen and water free conditions can be provided by using previously dried and degased solvents and reagents.

The inert oxygen and water free conditions can be provided by an argon atmosphere, a nitrogen atmosphere or other inert gas atmosphere and/or by using previously dried and degased solvents and reagents.

According to one embodiment, methods of removing molecular oxygen from solids or liquids are known in the art and include vacuum methods, gas displacement methods including 1) placing the material in a low molecular oxygen level environment such as a glove box (<1 ppm $O_2$) for at least 20 minutes; 2) purging the material with an inert gas such as $N_2$ or more preferably Argon gas; 3) purging (reducing pressure/pulling vacuum) and backfilling the material/vessel containing the material with inert gas (e.g. $N_2$, Ar) for several cycles (at least 3); 4) subjecting the material to at least 3 freeze, pump, thaw cycles (i.e. freeze the material in liquid nitrogen, place under reduced pressure/pull vacuum (e.g. −100 mTorr), back fill with inert gas, and then return the material to room temperature and repeat; and other methods known to those of skill in the art carried out at an appropriate temperature and for an appropriate period of time.

According to one embodiment, methods of removing molecular water from solids or liquids are known in the art and include vacuum methods, heating methods, molecular sieve methods, desiccator methods including 1) azeotroping off the molecular water by dissolving the material in solvent (e.g. toluene, benzene, isopropanol, etc.) and then removing the solvent under reduced pressure (e.g. −100 mTorr); and 2) freeze drying the material (i.e. dissolve the material in benzene, freeze the mixture and then apply reduced pressure to the frozen mixture (e.g. −100 mTorr) and allow the system to return to room temperature naturally with no external heating while under reduced pressure (as the benzene/water in the mixture azeotropes off the material, the material is kept cold by the endothermic process) and other methods known to those of skill in the art carried out at an appropriate temperature and for an appropriate period of time. Exemplary methods and apparatuses include the use of molecular sieves, nitrogen purging, vacuum desiccation, oven heating, vacuum removal or a combination thereof.

According to one embodiment, containers used for obtaining the nanoplatelets may be processed to reduce or eliminate molecular oxygen or molecular water that may be associated with the container. Such methods include purging the container with an inert gas such as nitrogen or heating the container at an elevated temperature to facilitate removal of molecular water or both.

According to one embodiment, methods of removing molecular oxygen and molecular water are known in the art and include adding an antioxidant molecule at at least one step of the process of growth of core-shell nanoplatelets comprising a ME shell on initial colloidal nanoplatelets. The antioxidant molecule will prevent the oxidation of the core-shell nanoplatelets.

According to one embodiment, the antioxidant molecule includes but is not limited to: glutathione, ascorbic acid, sodium ascorbate, calcium ascorbate, lipoic acid, uric acid, carotenes, α-tocopherol, γ-tocopherol, δ-tocopherol, ubiquinol, melatonin, diacetyl 5-6-1-ascorbic acid, palmityl 6-1-ascorbic acid, citric acid, sodium citrate, potassium citrate, calcium citrate, butylhydroxyanisol, butylhydroxytoluol, octyl gallate, dodecyl gallate, sodium lactate, potassium lactate, calcium lactate, cysteine, N,N'-di-2-butyl-1,4-phenylenediamine, phenols such as for example 2,6-di-tert-butyl-4-methylphenol, 2,4-dimethyl-6-tert-butylphenol, 2,6-di-tert-butyl-4-methylphenol, 2,6-di-tert-butylphenol.

According to one embodiment, the population of nanoplatelets substantially free of molecular oxygen and/or molecular water of the invention exhibits fluorescence quantum efficiency decrease of less than 50%, 40%, 30%, 25%, 20%, 15%, 10%, 5% after at least 300 hours, 400, 500, 600, 700, 800, 900, 1000 hours under light illumination. In this embodiment, the substantial lack of molecular oxygen and/or molecular water in the population of nanoplatelets prevents the oxidation of said population of nanoplatelets.

According to one embodiment, the nanoplatelets film or formulation substantially free of molecular oxygen and/or molecular water of the invention exhibits fluorescence quantum efficiency decrease of less than 50%, 40%, 30%, 25%, 20%, 15%, 10%, 5% after at least 300 hours, 400, 500, 600, 700, 800, 900, 1000 hours under light illumination. In this embodiment, the substantial lack of molecular oxygen and/or molecular water in the nanoplatelets film or formulation prevents the oxidation of said nanoplatelets film or formulation.

According to one embodiment, the light illumination is provided by blue or UV light source such as laser, diode or Xenon Arc Lamp. According to one embodiment, the photon flux of the illumination is comprised between 1 $mW\cdot cm^{-2}$ and 150 $W\cdot cm^{-2}$, more preferably between 10 $mW\cdot cm^{-2}$ and 100 $W\cdot cm^{-2}$, more preferably between 10 $mW\cdot cm^{-2}$ and 50 $W\cdot cm^{-2}$, and even more preferably between 10 $mW\cdot cm^{-2}$ and 30 $W\cdot cm^{-2}$.

According to one embodiment, the population of nanoplatelets substantially free of molecular oxygen and/or molecular water of the invention exhibits fluorescence quantum efficiency decrease of less than 50%, 40%, 30%, 25%, 20%, 15%, 10%, 5% after at least 300 hours, 400, 500, 600, 700, 800, 900, 1000 hours under light illumination with a photon flux of at least 1 $W\cdot cm^{-2}$, 5 $W\cdot cm^{-2}$, 10 $W\cdot cm^{-2}$, 20 $W\cdot cm^{-2}$, 30 $W\cdot cm^{-2}$, 40 $W\cdot cm^{2}$, 50 $W\cdot cm^{-2}$, 60 $W\cdot cm^{-2}$, 70 $W\cdot cm^{-2}$, 80 $W\cdot cm^{-2}$, 90 $W\cdot cm^{-2}$, 100 $W\cdot cm^{-2}$, 110 $W\cdot cm^{-2}$, 120 $W\cdot cm^{-2}$, 130 $W\cdot cm^{-2}$, 140 $W\cdot cm^{-2}$, 150 $W\cdot cm^{-2}$. In this embodiment, the substantial lack of molecular oxygen and/or molecular water in the population of nanoplatelets prevents the oxidation of said population of nanoplatelets.

According to one embodiment, the nanoplatelets film or formulation substantially free of molecular oxygen and/or molecular water of the invention exhibits fluorescence quantum efficiency decrease of less than 50%, 40%, 30%, 25%, 20%, 15%, 10%, 5% after at least 300 hours, 400, 500, 600, 700, 800, 900, 1000 hours under light illumination with a photon flux of at least 1 $W\cdot cm^{-2}$, 5 $W\cdot cm^{-2}$, 10 $W\cdot cm^{-2}$, 20 $W\cdot cm^{-2}$, 30 $W\cdot cm^{-2}$, 40 $W\cdot cm^{2}$, 50 $W\cdot cm^{-2}$, 60 $W\cdot cm^{-2}$, 70 $W\cdot cm^{-2}$, 80 $W\cdot cm^{-2}$, 90 $W\cdot cm^{-2}$, 100 $W\cdot cm^{-2}$, 110 $W\cdot cm^{-2}$, 120 $W\cdot cm^{-2}$, 130 $W\cdot cm^{-2}$, 140 $W\cdot cm^{-2}$, 150 $W\cdot cm^{-2}$. In this embodiment, the substantial lack of molecular oxygen and/or molecular water in the nanoplatelets film or formulation prevents the oxidation of said nanoplatelets film or formulation.

According to one embodiment, the population of nanoplatelets according to the present invention exhibit emission spectra with a full width half maximum lower than 50, 40, 30, 25 nm or 20 nm.

The present invention also relates to nanoplatelets formulation or film exhibiting desirable characteristics for use in display devices, such as narrow full width at half maximum, high quantum yield and resistance to photo-bleaching.

According to one embodiment, the nanoplatelets film comprises only colloidal nanoplatelets according to the present invention. According to one embodiment, the nanoplatelets film consists of colloidal nanoplatelets according to the present invention.

According to one embodiment the nanoplatelets film comprises 100% in weight of emissive semiconductor nanoparticles.

According to one embodiment, the nanoplatelets film comprises a host material, preferably a polymeric host material and emissive semiconductor nanoparticles embedded in said host material, wherein at least 20% of said emissive semiconductor nanoparticles are colloidal nanoplatelets according the invention.

In one embodiment, at least 20%, 30%, 40%, 50%, 60%, 70%, 80%, 90% of said emissive semiconductor nanoparticles are colloidal core-shell nanoplatelets according to the present invention. In one embodiment, substantially all of said emissive semiconductor nanoparticles are colloidal core-shell nanoplatelets according to the present invention.

In one embodiment, the nanoplatelets formulation or film comprises less than 90% in weight of emissive semiconductor nanoparticles.

In one embodiment, the nanoplatelets formulation or film comprises less than 90%, 80%, 70%, 60%, 50% in weight of emissive semiconductor nanoparticles, preferentially less than 10%.

In one embodiment, the nanoplatelets film has a thickness between 30 nm and 1 cm, more preferably between 100 nm and 1 mm, even more preferably between 100 nm and 500 µm.

In one embodiment, the nanoplatelets film refers to a layer, sheet or film of nanoplatelets.

In one embodiment, the nanoplatelets film refers to a layer, sheet or film of host material that comprises a plurality of nanoplatelets.

In one embodiment, the formulation comprises the nanoplatelets of the invention and at least one solvent. The solvent include, but is not limited to pentane, hexane, heptane, cyclohexane, petroleum ether, toluene, benzene, xylene, chlorobenzene, carbon tetrachloride, chloroform, dichloromethane, 1,2-dichloroethane, THF (tetrahydrofuran), acetonitrile, acetone, ethanol, methanol, ethyl acetate, ethylene glycol, diglyme (diethylene glycol dimethyl ether), diethyl ether, DME (1,2-dimethoxy-ethane, glyme), DMF (dimethylformamide), NMF (N-methylformamide), FA (Formamide), DMSO (dimethyl sulfoxide), 1,4-Dioxane, triethyl amine or mixture thereof.

According to one embodiment, the host material is transparent in the visible range of wavelength.

According to one embodiment, the host material is a polymeric host material.

In one embodiment, the polymeric host material is free of molecular oxygen and/or molecular water.

In one embodiment, the polymeric host material is a polymer particle.

In one embodiment, the polymeric host material is a spherical polymer particle.

In one embodiment, the polymeric host material include but is not limited to silicone-based polymers, polydimethylsiloxanes (PDMS), polyethylene terephthalate, polyesters, polyacrylates, polymethacrylates, polycarbonate, poly(vinyl alcohol), polyvinylpyrrolidone, polyvinylpiridine, polysaccharides, poly(ethylene glycol), melamine resins, a phenol resin, an alkyl resin, an epoxy resin, a polyurethane resin, a maleic resin, a polyamide resin, an alkyl resin, a maleic resin, terpenes resins, copolymers forming the resins, polymerizable monomers comprising an UV initiator or thermic initiator.

According to one embodiment, the host material is an inorganic host material.

In one embodiment, the inorganic host material is free of molecular oxygen and/or molecular water.

In one embodiment, the inorganic host material includes but is not limited to oxides such as for example $Al_2O_3$, $SiO_2$, $ZrO_2$, or $TiO_2$, zeolites, SiC, or a mixture thereof.

In one embodiment, the host material may be a polymerizable formulation which can include monomers, oligomers or polymers and mixture thereof.

In one embodiment, the polymerizable formulation including the nanoplatelets may further comprise a crosslinking agent, a scattering agent, a photo initiator or a thermal initiator.

In one embodiment, the polymerizable formulation includes but is not limited to monomers, oligomers or polymers made from an alkyl methacrylates or an alkyl acrylates such as acrylic acid, methacrylic acid, crotonic acid, acrylonitrile, acrylic esters substituted with methoxy, ethoxy, propoxy, butoxy, and similar derivatives for example, methyl acrylate, ethyle acrylate, propyl acrylate, butyl acrylate, isobutyl acrylate, lauryl acrylate, norbornyl acrylate, 2-ethyl hexyl acrylate, 2-hydroxyethyl acrylate, 4-hydroxybutyl acrylate, benzyl acrylate, phenyl acrylate, isobornyle acrylate, hydroxypropyl acrylate, fluorinated acrylic monomers, chlorinated acrylic monomers, methacrylic acid, methyl methacrylate, n-butyl methacrylate, isobutyl methacrylate, 2-ethyl hexyl methacrylate, 2-hydroxyethyl methacrylate, 4-hydroxybutyl methacrylate, benzyl methacrylate, phenyl methacrylate, lauryl methacrylate, norbornyl methacrylate, isobornyle methacrylate, hydroxypropyl methacrylate, fluorinated methacrylic monomers, chlorinated methacrylic monomers, alkyl crotonates, allyl crotonates, glycidyl methacrylate and related esters.

In another embodiment, the polymerizable formulation includes but is not limited to monomers, oligomers or polymers made from an alkyl acrylamide or alkyl methacrylamide such as acrylamide, Alkylacrylamide, N-tert-Butylacrylamide, Diacetone acrylamide, N,N-Diethylacrylamide, N-(Isobutoxymethyl)acrylamide, N-(3-Methoxypropyl)acrylamide, N-Diphenylmethylacrylamide, N-Ethylacrylamide, N-Hydroxyethyl acrylamide, N-(Isobutoxymethyl)acrylamide, N-Isopropylacrylamide, N-(3-Methoxypropyl)acrylamide, N-Phenylacrylamide, N-[Tris(hydroxymethyl)methyl]acrylamide, N,N-Diethylmethacrylamide, N,N-Dimethylacrylamide, N-[3-(Dimethylamino)propyl]méthacrylamide, N-(Hydroxymethyl) acrylamide, 2-Hydroxypropyl methacrylamide, N-Isopropylmethacrylamide, Methacrylamide, N-(Triphenylmethyl) methacrylamide and similar derivatives.

In another embodiment, the polymerizable formulation includes but is not limited to monomers, oligomers or polymers made from alpha-olefins, dienes such as butadiene and chloroprene; styrene, alpha-methyl styrene, and the like; heteroatom substituted alpha-olefins, for example, vinyl acetate, vinyl alkyl ethers for example, ethyl vinyl ether, vinyltrimethylsilane, vinyl chloride, tetrafluoroethylene, chlorotrifluoroethylene, cyclic and polycyclic olefin compounds for example, cyclopentene, cyclohexene, cycloheptene, cyclooctene, and cyclic derivatives up to $C_{20}$; polycyclic derivates for example, norbornene, and similar derivatives up to $C_{20}$; cyclic vinyl ethers for example, 2, 3-dihydrofuran, 3,4-dihydropyran, and similar derivatives; allylic alcohol derivatives for example, vinylethylene carbonate, disubstituted olefins such as maleic and fumaric compounds for example, maleic anhydride, diethylfumarate, and the like, and mixtures thereof.

In one embodiment, example of a crosslinking agent includes but is not limited to di-acrylate, tri-acrylate, tetra-acrylate, di-methacrylate, tri-methacrylate and tetra-methacrylate monomers derivatives and the like. Another example of crosslinking agent includes but is not limited to monomers, oligomers or polymers made from di- or tri-functionnal monomers such as allyl methacrylate, diallyl maleate, 1,3-butanediol dimethacrylate, 1,4-butanediol dimethacrylate, 1,6-hexanediol dimethacrylate, pentaerythritol triacrylate, trimethylolpropane triacrylate, Ethylene glycol dimethacrylate, Triethylene glycol dimethacrylate, N,N-methylenebis(acrylamide), N,N'-Hexamethylenebis (methacrylamide), and divinyl benzene.

In one embodiment, the polymerizable formulation may further comprise a scattering agent. Example of a scattering agent includes but is not limited to $SiO_2$, $ZrO_2$, $TiO_2$, alumina, barium sulfate, PTFE, barium titanate and the like.

In one embodiment, the polymerizable formulation may further comprise a photo initiator. Example of a photo initiator includes but is not limited to α-hydroxyketone, phenylglyoxylate, benzyldimethyl-ketal, α-aminoketone, monoacylphosphine oxides, bisacylphosphine oxides, phosphine oxide, benzophenone and derivatives, polyvinyl cinnamate, metallocene or iodonium salt derivatives and the like. Another example of photo initiator includes Irgacure® photoinitiator and Esacure® photoinitiator and the like.

In one embodiment, the polymerizable formulation may further comprise a thermal initiator. Example of a thermal initiator includes but is limited to peroxide compounds, azo compounds such as azobisisobutyronitrile (AIBN) and 4,4-Azobis(4-cyanovaleric acid), Potassium and ammonium persulfate, tert-Butyl peroxide, benzoyl peroxide and the like.

In one embodiment the polymeric host material may be a polymerized solid made from an alkyl methacrylates or an alkyl acrylates such as acrylic acid, methacrylic acid, crotonic acid, acrylonitrile, acrylic esters substituted with methoxy, ethoxy, propoxy, butoxy, and similar derivatives for example, methyl acrylate, ethyle acrylate, propyl acrylate, butyl acrylate, isobutyl acrylate, lauryl acrylate, norbornyl acrylate, 2-ethyl hexyl acrylate, 2-hydroxyethyl acrylate, 4-hydroxybutyl acrylate, benzyl acrylate, phenyl acrylate, isobornyle acrylate, hydroxypropyl acrylate, fluorinated acrylic monomers, chlorinated acrylic monomers, methacrylic acid, methyl methacrylate, n-butyl methacrylate, isobutyl methacrylate, 2-ethyl hexyl methacrylate, 2-hydroxyethyl methacrylate, 4-hydroxybutyl methacrylate, benzyl methacrylate, phenyl methacrylate, lauryl methacrylate, norbornyl methacrylate, isobornyle methacrylate, hydroxypropyl methacrylate, fluorinated methacrylic monomers, chlorinated methacrylic monomers, alkyl crotonates, allyl crotonates, glycidyl methacrylate and related esters.

In one embodiment the polymeric host material may be a polymerized solid made from an alkyl acrylamide or alkyl méthacrylamide such as acrylamide, Alkylacrylamide, N-tert-Butylacrylamide, Diacetone acrylamide, N,N-Diethylacrylamide, N-(Isobutoxymethyl)acrylamide, N-(3-Methoxypropyl)acrylamide, N-Diphenylmethylacrylamide, N-Ethylacrylamide, N-Hydroxyethyl acrylamide, N-(Isobutoxymethyl)acrylamide, N-Isopropylacrylamide, N-(3-Methoxypropyl)acrylamide, N-Phenylacrylamide, N-[Tris(hydroxymethyl)methyl]acrylamide, N,N-Diethylmethacrylamide, N,N-Dimethylacrylamide, N-[3-(Dimethylamino)propyl]methacrylamide, N-(Hydroxymethyl) acrylamide, 2-Hydroxypropyl methacrylamide, N-Isopropylmethacrylamide, Methacrylamide, N-(Triphenylmethyl) methacrylamide and similar derivatives.

In one embodiment the polymeric host material may be a polymerized solid made from alpha-olefins, dienes such as butadiene and chloroprene; styrene, alpha-methyl styrene, and the like; heteroatom substituted alpha-olefins, for example, vinyl acetate, vinyl alkyl ethers for example, ethyl vinyl ether, vinyltrimethylsilane, vinyl chloride, tetrafluoroethylene, chlorotrifluoroethylene, cyclic and polycyclic olefin compounds for example, cyclopentene, cyclohexene, cycloheptene, cyclooctene, and cyclic derivatives up to C20; polycyclic derivates for example, norbornene, and similar derivatives up to C20; cyclic vinyl ethers for example, 2, 3-dihydrofuran, 3,4-dihydropyran, and similar derivatives; allylic alcohol derivatives for example, vinylethylene carbonate, disubstituted olefins such as maleic and fumaric compounds for example, maleic anhydride, diethylfumarate, and the like, and mixtures thereof.

In one embodiment, the polymeric host material may be PMMA, Poly(lauryl methacrylate), glycolized poly(ethylene terephthalate), Poly(maleic anhydride-alt-octadecene) and mixtures thereof.

In another embodiment, the film comprises the nanoplatelets and a host material, preferably a polymeric host material and at least one solvent. According to this embodiment, the solvent is one that allow the solubilization of the nanoplatelets and polymeric host material such as for example, pentane, hexane, heptane, cyclohexane, petroleum ether, toluene, benzene, xylene, chlorobenzene, carbon tetrachloride, chloroform, dichloromethane, 1,2-dichloroethane, THF (tetrahydrofuran), acetonitrile, acetone, ethanol, methanol, ethyl acetate, ethylene glycol, diglyme (diethylene glycol dimethyl ether), diethyl ether, DME (1,2-dimethoxy-ethane, glyme), DMF (dimethylformamide), NMF (N-methylformamide), FA (Formamide), DMSO (dimethyl sulfoxide), 1,4-Dioxane, triethyl amine or mixture thereof.

In another embodiment, the film comprises the nanoplatelets and a host material, preferably a polymeric host material, and does not comprise a solvent. In this embodiment, the nanoplatelets and host material of this material can be mixed by an extrusion process.

In another embodiment, the formulation comprises the nanoplatelets and at least one polymerizable polymer as described here above.

According to one embodiment, the nanoplatelets formulation or film further comprises scattering elements dispersed in the host material. Example of a scattering agent includes but is not limited to $SiO_2$, $ZrO_2$, $TiO_2$, alumina, barium sulfate, PTFE, barium titanate and the like.

In one embodiment, the nanoplatelets formulation or film comprises at least one population of nanoplatelets. In the present application, as illustrated in FIG. 17, a population of nanoplatelets is defined by the maximum emission wavelength.

In one embodiment, the nanoplatelets formulation or film comprises two populations of nanoplatelets with different colors. In one embodiment, the nanoplatelets formulation or film consists of nanoplatelets which emit green light and red light upon down-conversion of a blue light source. Thus, the blue light from the light source(s) passes through the nanoplatelets film, where predetermined amounts of green and red light are mixed with the remaining blue light to create the tri-chromatic white light.

In one embodiment, the nanoplatelets formulation or film comprises two populations of nanoplatelets, a first population with a maximum emission wavelength between 500 nm and 560 nm, more preferably between 515 nm and 545 nm and a second population with a maximum emission wavelength between 600 nm and 700 nm, more preferably between 610 nm and 650 nm.

In one embodiment, the nanoplatelets formulation or film comprises two populations of core-shell nanoplatelets with different color. In one embodiment, the nanoplatelets film comprises two populations of core-shell nanoplatelets one is green and one is red.

In one embodiment, the nanoplatelets formulation or film comprises a blend of two populations of core-shell nanoplatelets with different colors.

In one embodiment, the nanoplatelets formulation or film is splitted in several areas each of them comprise a different population having different color of core-shell nanoplatelets.

In one embodiment, the nanoplatelets formulation or film is made of a stack of two formulations or films, each of them comprises a different population of nanoplatelets having a different color.

In another embodiment, the nanoplatelets formulation or film comprising at least one population of nanoplatelets, may further comprise at least one population of converters having phosphor properties. Examples of converters having phosphor properties include, but are not limited to, garnets (LuAG, GAL, YAG, GaYAG), silicates, oxynitrides/oxycarbidonitrides, nintrides/carbidonitrides, $Mn^{4+}$ red phosphors (PFS/KFS), quantum dots.

In another embodiment, the nanoplatelets formulation or film may further comprises elements able to drain away the heat if it is a good thermal conductor. Examples of said elements able to drain away the heat include but are not limited to: $SiO_2$, $ZrO_2$, $TiO_2$, $Al_2O_3$.

In another embodiment, the nanoplatelets formulation or film may further comprises conductive elements able to conduct electrical charges. Said conductive elements comprise any conductive elements known by the skilled artisan.

In one embodiment, the nanoplatelets formulation or film is made free of molecular oxygen and/or molecular water.

In one embodiment, the one or more components of the nanoplatelets formulation or film are free of molecular oxygen and/or molecular water.

In one embodiment, molecular oxygen and/or molecular water are removed from one or more components of the nanoplatelets formulation or film.

In one embodiment, molecular oxygen and/or molecular water are removed from one or more components of the nanoplatelets formulation or film prior to mix with any other components or nanoplatelets according to the present invention.

According to one embodiment, methods to remove molecular oxygen and/or molecular water known to those of skill in the art may be used to remove molecular oxygen and/or molecular water from one or more components of the nanoplatelets formulation or film.

Methods to remove molecular oxygen and/or molecular water are described here above.

In one embodiment, the nanoplatelets formulation or film is encapsulated into a multi-layered system. In one embodiment, the encapsulated nanoplatelets formulation or film is made of at least two layers. In one embodiment, the encapsulated nanoplatelets formulation or film is made of at least three layers. In one embodiment, the layer may be a film or a sheet.

In one embodiment, the encapsulated nanoplatelets formulation or film comprises at least one auxiliary layer.

In one embodiment, the nanoplatelets formulation or film is covered by at least one auxiliary layer or sandwiched by at least two auxiliary layers.

In one embodiment, the nanoplatelets formulation or film is enclosed in at least one auxiliary layer.

In one embodiment, the nanoplatelets formulation or film is surrounded by at least one auxiliary layer.

According to one embodiment, the auxiliary layer is a polymeric auxiliary layer. According to one embodiment, the auxiliary layer is transparent in the visible range of wavelength. According to one embodiment, the auxiliary layer protects the nanoplatelets formulation or film from molecular oxygen, molecular water and/or temperature. In this embodiment, the auxiliary layer prevents the oxidation, or the deterioration, by molecular oxygen, molecular water, or temperature, of the nanoplatelets formulation or film. Thus, in this embodiment, the nanoplatelets film or formulation substantially free of molecular oxygen and/or molecular water protected by at least one auxiliary layer exhibits fluorescence quantum efficiency decrease of less than 50%, 40%, 30%, 25%, 20%, 15%, 10%, 5% after at least 300 hours, 400, 500, 600, 700, 800, 900, 1000 hours under light illumination with a photon flux of at least 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$.

According to one embodiment, the one or more components of the auxiliary layer can include a polymerizable component, a crosslinking agent, a scattering agent, a rheology modifier, a filler, a photoinitiator, or a thermal initiator as described here after or above.

According to one embodiment, the auxiliary layer comprises scattering agents. Example of a scattering agent includes but is not limited to $SiO_2$, $ZrO_2$, $TiO_2$, alumina, barium sulfate, PTFE, barium titanate and the like.

In one embodiment, the auxiliary layer has a thickness between 30 nm and 1 cm, between 100 nm and 1 mm, preferably between 100 nm and 500 μm.

According to one embodiment, the auxiliary layer may comprise a polymeric host material as described here above.

In one embodiment, the auxiliary layer is made free of molecular oxygen and/or molecular water.

In one embodiment, the auxiliary layer is substantially free of molecular oxygen and/or molecular water.

According to one embodiment, molecular oxygen may be present in a volume of the auxiliary layer in an amount of less than about 10 parts per million (ppm), 5 ppm, 4 ppm, 3 ppm, 2 ppm, 1 ppm, 500 parts per billion (ppb), 300 ppb or less than about 100 ppb. According to one embodiment, molecular water may be present in a volume of the auxiliary layer in an amount of less than about 100 ppm, 50 ppm, 10 ppm, 5 ppm, 4 ppm, 3 ppm, 2 ppm, or less than about 1 ppm.

According to one embodiment, molecular oxygen may be present in a volume of one or more components of the auxiliary layer in an amount of less than about 10 ppm 5 ppm, 4 ppm, 3 ppm, 2 ppm, 1 ppm, 500 ppb, 300 ppb or in an amount of less than about 100 ppb. According to one embodiment, molecular water may be present in a volume of one or more components of the auxiliary layer in an amount of less than about 100 ppm, 50 ppm, 10 ppm, 5 ppm, 4 ppm, 3 ppm, 2 ppm, or in an amount of less than 1 ppm.

In one embodiment, molecular oxygen may be present in the auxiliary layer in an amount of less than about 10 ppm, 5 ppm, 4 ppm, 3 ppm, 2 ppm, 1 ppm, 500 ppb, 300 ppb or in an amount of less than about 100 ppb. In one embodiment, molecular water may be present in the auxiliary layer in an amount of less than about 100 ppm, 50 ppm, 10 ppm, 5 ppm, 4 ppm, 3 ppm, 2 ppm, or in an amount of less than 1 ppm.

In one embodiment, the one or more components of the auxiliary layer are free of molecular oxygen and/or molecular water.

In one embodiment, molecular oxygen and molecular water are removed from one or more components of the auxiliary layer.

Methods to remove molecular oxygen and/or molecular water are described here above.

In one embodiment, molecular oxygen and molecular water are removed from one or more components of the auxiliary layer prior to mix with any other components according to the present invention.

According to one embodiment, methods to remove molecular oxygen and/or molecular water known to those of skill in the art may be used to remove molecular oxygen and/or molecular water from one or more components of the auxiliary layer.

The present invention also relates to an encapsulated nanoplatelets formulation or film where the nanoplatelets formulation or film is covered by at least one protective layer. In one embodiment, the nanoplatelets formulation or film is surrounded by at least one protective layer. In another embodiment, the nanoplatelets formulation or film may be covered by at least one auxiliary layer, both being then surrounded by at least one protective layer.

In one embodiment, the encapsulated nanoplatelets formulation or film comprises at least one auxiliary layer and/or at least one protective layer.

In one embodiment, the protective layer is free of molecular oxygen and/or molecular water.

In one embodiment, the protective layer is a molecular oxygen and/or molecular water impermeable layer. In one embodiment, the protective layer is a molecular oxygen and/or molecular water non-permeable layer. In one embodiment, the protective layer protects the nanoplatelets formulation or film from molecular oxygen, molecular water and/or temperature. In this embodiment, the protective layer prevents the oxidation, or the deterioration, by molecular oxygen, molecular water, or temperature, of the nanoplatelets formulation or film. Thus, in this embodiment, the nanoplatelets film or formulation substantially free of molecular oxygen and/or molecular water protected by at least one protective layer exhibits fluorescence quantum efficiency decrease of less than 50%, 40%, 30%, 25%, 20%, 15%, 10%, 5% after at least 300 hours, 400, 500, 600, 700, 800, 900, 1000 hours under light illumination with a photon flux of at least 1 $W \cdot cm^{-2}$, 5 $W \cdot cm^2$ 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^2$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$.

In one embodiment, the nanoplatelets formulation or film is enclosed in at least one molecular oxygen and/or molecular water non-permeable layer or sandwiched by at least two molecular oxygen and/or molecular water non-permeable layers. In one embodiment, the nanoplatelets formulation or film is enclosed in at least one molecular oxygen and/or molecular water impermeable layer or sandwiched by at least two molecular oxygen and/or molecular water impermeable layers.

In one embodiment, the protective layer can be made of glass, PET (Polyethylene terephthalate), PDMS (Polydimethylsiloxane), PES (Polyethersulfone), PEN (Polyethylene naphthalate), PC (Polycarbonate), PP (Polypropylene), PI (Polyimide), PNB (Polynorbornene), PAR (Polyarylate), PEEK (Polyetheretherketone), PCO (Polycyclic olefins), PVDC (Polyvinylidene chloride), Nylon, ITO (Indium tin oxide), FTO (Fluorine doped tin oxide), cellulose, $Al_2O_3$, $SiO_2$, SiC, $ZrO_2$, $TiO_2$, ceramic, organic modified ceramic and mixture thereof.

In one embodiment, the protective layer can be deposited by PECVD (Plasma Enhanced Chemical Vapor Deposition), ALD (Atomic Layer Deposition), CVD (Chemical Vapor Deposition), iCVD (Initiator Chemical Vapor Deposition), Cat-CVD (Catalytic Chemical Vapor Deposition).

In one embodiment, the protective layer surrounds, covers, and encloses totally the encapsulated nanoplatelets formulation or film.

In one embodiment, the protective layer surrounds, covers, and encloses partially the encapsulated nanoplatelets formulation or film.

In one embodiment, the nanoplatelets formulation or film is covered by at least one protective layer or sandwiched by at least two protective layers.

In one embodiment, the nanoplatelets formulation or film is enclosed in at least one protective layer.

In one embodiment, the nanoplatelets formulation or film is surrounded by at least one protective layer.

In one embodiment, the auxiliary layer is covered by at least one protective layer or sandwiched by at least two protective layers.

In one embodiment, the auxiliary layer or film is enclosed in at least one protective layer or film.

In one embodiment, the auxiliary layer or film is surrounded by at least one protective layer or film.

According to one embodiment, the protective layer may comprise scattering agents. Example of a scattering agent includes but is not limited to $SiO_2$, $ZrO_2$, $TiO_2$, alumina, barium sulfate, PTFE, barium titanate and the like.

In one embodiment, the encapsulated nanoplatelets formulation or film also comprises at least one substrate which is transparent in the visible range of wavelength.

According to one embodiment, as shown in FIG. 1, the encapsulated nanoplatelets formulation or film according to the present invention can be a nanoplatelets formulation or film surrounded on his sides by an auxiliary layer and sandwiched by two protective layers. In one embodiment, the encapsulated nanoplatelets formulation or film is in the form of a film.

According to one embodiment, as shown in FIG. 2, the encapsulated nanoplatelets formulation or film according to the present invention can be a nanoplatelets formulation or film deposed on a protective layer, then covered totally by an auxiliary layer. Finally, a second protective layer is deposed on top of the auxiliary layer.

According to one embodiment, as shown in FIG. 3, the encapsulated nanoplatelets formulation or film according to the present invention can be a nanoplatelets formulation or film enclosed in an auxiliary layer which is sandwiched by two protective layers.

According to one embodiment, as shown in FIG. 4, the encapsulated nanoplatelets formulation or film according to the present invention can be a nanoplatelets formulation or film enclosed in a protective layer in form of a tube, a vessel or a capillary. In one embodiment, the encapsulated nanoplatelets formulation or film is in the form of a tube, a vessel or a capillary. In another embodiment, the protective layer is a tube, vessel or capillary comprising the nanoplatelets formulation or film.

According to one embodiment, as shown in FIG. 5, the encapsulated nanoplatelets formulation or film according to the present invention can be a nanoplatelets formulation or film surrounded totally by an auxiliary layer which is enclosed in a protective layer in form of a tube, a vessel or a capillary. In one embodiment, the protective layer is a tube, vessel or capillary comprising the nanoplatelets formulation or film and an auxiliary layer.

In one embodiment, the core-shell nanoplatelets have a polarized emission. According to one embodiment, the polarized emission of core-shell nanoplatelets is used to build a 3D display.

In one embodiment, the nanoplatelets formulation or film is placed on a support or in a support.

In one embodiment, the support can be a substrate, a LED, a LED array, a vessel, a tube or a container. Preferably the support is transparent at wavelengths from 200 nm to 2500 nm, from 200 nm to 2000 nm, from 200 nm to 1500 nm, from 200 nm to 1000 nm, from 350 nm to 800 nm.

LED as used herein includes LED, LED chip and microsized LED.

In one embodiment, the nanoplatelets formulation or film is illuminated using UV light with a wavelength ranging from 200 nm to 400 nm. In one embodiment, the nanoplatelets formulation or film is illuminated using a blue LED with a wavelength ranging from 400 nm to 470 nm such as for instance a gallium nitride based diode. In one embodiment, the nanoplatelets formulation or film is deposited on a blue LED with a wavelength ranging from 400 nm to 470 nm. In one embodiment, the nanoplatelets formulation or films is deposited on a LED with an emission peak at about 405 nm. In one embodiment, the nanoplatelets formulation or film is deposited on a LED with an emission peak at about 447 nm. In one embodiment, the nanoplatelets formulation or film is deposited on a LED with an emission peak at about 455 nm.

In one embodiment, the encapsulated nanoplatelets formulation is illuminated by a photon flux between 1 $\mu W \cdot cm^{-2}$ and 1 $kW \cdot cm^{-2}$ and more preferably between 1 $mW \cdot cm^{-2}$ and 100 $W \cdot cm^{-2}$, and even more preferably between 1 $mW \cdot cm^{-2}$ and 30 $W \cdot cm^{2}$.

In one embodiment, the nanoplatelets are used to down-shift the light from a blue or UV source. In one embodiment, the term light source may also relate to a plurality of light source. In one embodiment, the LED used to illuminate the nanoplatelets film is a GaN diode, a InGaN diode, a GaAlN diode, a GaAlPN diode, a AlGaAs diode, a AlGaInP diode, a AlGaInN diode.

In one embodiment, the nanoplatelets formulation or film can be deposited on the support by spray-coating, dip-coating, spin-coating or drop-coating.

The invention further relates to an encapsulated nanoplatelets light emitting device comprising a LED and an encapsulated nanoplatelets formulation or film.

According to one embodiment, a LED comprises at least one, 1, 2, 3, 4, 5, 10, 20, 30, 40, 50, 60, 70, 80, 90, 100, 500, 1000, 5000, 10000, 50000, 100000, 150000, 200000, 250000, 300000, 350000, 400000, 450000, 500000, 550000, 600000, 650000, 750000, 800000, 850000, 900000, 950000, 1000000 pixels.

In one embodiment, an encapsulated nanoplatelets light emitting device is an encapsulated nanoplatelets formulation or film on a LED.

According to one embodiment, the encapsulated nanoplatelets formulation or film is on top of a LED chip.

According to one embodiment, the encapsulated nanoplatelets formulation or film is on top of a LED array or a microsized LED array.

According to one embodiment, the encapsulated nanoplatelets formulation or film is deposited and patterned on top of a LED array or a microsized LED array.

According to one embodiment, the encapsulated nanoplatelets formulation or film is deposited and patterned on top of a LED, a LED array, a microsized LED or a microsized LED array using a lift-off technique, lithography, or a direct etching of the encapsulated nanoplatelets formulation or film.

According to one embodiment, the encapsulated nanoplatelets formulation or film is deposited and patterned on top of a LED, a LED array, a microsized LED or a microsized LED array by spray-coating, dip-coating, spin-coating or drop-coating.

In one embodiment, the encapsulated nanoplatelets formulation or film covers the LED chip.

In one embodiment, the encapsulated nanoplatelets formulation or film covers and surrounds partially or totally the LED chip.

In one embodiment, the LED chip or the microsized LED is a blue LED with a wavelength ranging from 400 nm to 470 nm such as for instance a gallium nitride based diode.

In one embodiment, the LED chip or the microsized LED is a blue LED with a wavelength ranging from 400 nm to 470 nm. In one embodiment, the LED chip or the microsized LED has an emission peak at about 405 nm. In one embodiment, the LED chip or the microsized LED has an emission peak at about 447 nm. In one embodiment, the LED chip or the microsized LED has an emission peak at about 455 nm.

In one embodiment, the LED chip or the microsized LED is a green LED with a wavelength ranging from 500 nm to 560 nm. In one embodiment, the LED chip or the microsized LED has an emission peak at about 515 nm. In one embodiment, the LED chip or the microsized LED has an emission peak at about 525 nm. In one embodiment, the LED chip or the microsized LED has an emission peak at about 540 nm.

In one embodiment, the LED chip or the microsized LED has a photon flux between 1 $\mu W \cdot cm^{-2}$ and 1 $kW \cdot cm^{-2}$ and more preferably between 1 $mW \cdot cm^{-2}$ and 100 $W \cdot cm^{-2}$, and even more preferably between 1 $mW \cdot cm^{-2}$ and 30 $W \cdot cm^{-2}$.

In one embodiment, the LED chip is a GaN diode, a InGaN diode, a GaAlN diode, a GaAlPN diode, a AlGaAs diode, a AlGaInP diode, a AlGaInN diode.

In one embodiment, the microsized LED is a GaN diode, a InGaN diode, a GaAlN diode, a GaAlPN diode, a AlGaAs diode, a AlGaInP diode, a AlGaInN diode.

In one embodiment, a LED array comprises an array of GaN diodes, InGaN diodes, GaAlN diodes, GaAlPN diodes, AlGaAs diodes, AlGaInP diodes, AlGaInN diodes, or a mixture thereof.

According to one embodiment, the microsized LED comprises at least one pixel.

According to one embodiment, the microsized LED comprises one pixel. In this embodiment, the microsized LED and the one pixel are combined.

According to one embodiment, the pixel pitch is 1 µm, 2 µm, 3 µm, 4 µm, 5 µm, 6 µm, 7 µm, 8 µm, 9 µm, 10 µm, 11 µm, 12 µm, 13 µm, 14 µm, 15 µm, 16 µm, 17 µm, 18 µm, 19 µm, 20 µm.

According to one embodiment, the pixel pitch is smaller than 10 µm.

According to one embodiment, the encapsulated nanoplatelets formulation or film is on top of a microsized LED.

In one embodiment, the encapsulated nanoplatelets formulation or film covers a pixel of a microsized LED array without overlapping between the pixels of said microsized LED array.

In one embodiment, the encapsulated nanoplatelets formulation or film covers partially a pixel of a microsized LED array without overlapping between the pixels of said microsized LED array.

In one embodiment, the encapsulated nanoplatelets formulation or film covers and surround partially or totally a pixel of a microsized LED array without overlapping between the pixels of said microsized LED array.

In one embodiment, the encapsulated nanoplatelets formulation or film covers a microsized LED array without overlapping between the pixels of said microsized LED array.

In one embodiment, the encapsulated nanoplatelets formulation or film covers partially a microsized LED array without overlapping between the pixels of said microsized LED array.

In one embodiment, the the encapsulated nanoplatelets formulation or film covers and surround partially or totally a microsized LED array without overlapping between the pixels of said microsized LED array.

According to one embodiment, after deposition, the encapsulated nanoplatelets formulation or film is coated with an auxiliary layer as described here above. In this embodiment, the auxiliary layer protects the encapsulated nanoplatelets formulation or film from oxygen, water and/or temperature.

According to one embodiment, after deposition, the encapsulated nanoplatelets formulation or film is coated with a protective layer as described here above. In this embodiment, the protective layer protects the encapsulated nanoplatelets formulation or film from oxygen, water and/or temperature.

According to one embodiment, as shown in FIG. 7, the encapsulated nanoplatelets light emitting device according to the present invention can be a nanoplatelets formulation or film deposed on top of a LED chip (see FIG. 6) and surrounded by an auxiliary layer which is covered by a protective layer.

According to one embodiment, as shown in FIG. 8, the encapsulated nanoplatelets light emitting device according to the present invention can be a nanoplatelets formulation or film deposited on top of a LED chip (see FIG. 6) and covered by a protective layer.

According to one embodiment, as shown in FIG. 9, the encapsulated nanoplatelets light emitting device according to the present invention can be a nanoplatelets formulation or film, surrounding totally the LED chip, sandwiched by an auxiliary layer which is covered by a protective layer.

According to one embodiment, as shown in FIG. 10, the encapsulated nanoplatelets light emitting device according to the present invention can be a nanoplatelets formulation or film, surrounding totally the LED chip, covered by a protective layer.

According to one embodiment, as shown in FIG. 11, the encapsulated nanoplatelets light emitting device according to the present invention can be an auxiliary layer, surrounding totally the LED chip, sandwiched by a nanoplatelets formulation or film which is covered by a protective layer.

In one embodiment, at least one encapsulated nanoplatelets formulation or film comprising one population of nanoplatelets is deposited on a microsized LED array. In one embodiment, a population of nanoplatelets is defined by the maximum emission wavelength.

In one embodiment, at least one encapsulated nanoplatelets formulation or film comprising at least one population of nanoplatelets is deposited on a pixel of a microsized LED array.

In one embodiment, at least one encapsulated nanoplatelets formulation or film comprising two populations of nanoplatelets with different colors are deposited on a microsized LED array.

In one embodiment, at least one encapsulated nanoplatelets formulation or film comprising two populations of nanoplatelets which emit green light and red light upon downconversion of a blue light source are deposited on a microsized LED array.

In one embodiment, the encapsulated nanoplatelets formulation or film comprising two populations of nanoplatelets comprise a first population with a maximum emission wavelength between 500 nm and 560 nm, more preferably between 515 nm and 545 nm and a second population with a maximum emission wavelength between 600 nm and 750 nm, more preferably between 610 nm and 650 nm.

In one embodiment, the encapsulated nanoplatelets formulation or film exhibits photoluminescence quantum yield (PLQY) decrease of less than 50%, 40%, 30%, 25%, 20%, 15%, 10%, 5% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, 50000 hours under light illumination.

According to one embodiment, the light illumination is provided by blue or UV light source such as laser, diode or Xenon Arc Lamp. According to one embodiment, the photon flux of the illumination is comprised between 1 mW·cm$^{-2}$ and 150 W·cm$^{-2}$ and more preferably between 10 mW·cm$^{-2}$ and 100 W·cm$^{-2}$, more preferably between 10 W·cm$^{-2}$ and 50 W·cm$^{-2}$ and even more preferably between 10 mW·cm$^{-2}$ and 30 W·cm$^{2}$.

In one embodiment, the encapsulated nanoplatelets formulation or film exhibits fluorescence quantum efficiency (PQLY) decrease of less than 50%, 40%, 30%, 25%, 20%, 15%, 10%, 5% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, 50000 hours under light illumination with a photon flux of at least 1 W·cm$^{-2}$, 5 W·cm$^{-2}$, 10 W·cm$^{-2}$, 20 W·cm$^{2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{2}$.

The present invention further relates to a lighting device comprising at least one encapsulated nanoplatelets light emitting device as described here above.

The present invention also relates to a backlight unit comprising at least one light source, a light guide plate with light recycling elements and an encapsulated nanoplatelets film or formulation. The light guide plate is configured to guide the light exiting from the light source and/or the nanoplatelets formulation or film, and the light recycling elements are configured to collimate the light in a given direction.

In one embodiment (FIG. 12), the at least one light source illuminate on the side of the guide plate and the nanoplatelets formulation or film is placed above the light guide plate.

In another embodiment (FIG. 13), the at least one light source illuminate the nanoplatelets formulation or film, which illuminate further on the side of the light guide plate.

The present invention further relates to a backlight unit comprising at least one encapsulated nanoplatelets light emitting device, a light guide plate with light recycling elements.

In one embodiment (FIG. 14), the at least one encapsulated nanoplatelets light emitting device illuminate on the side of the light guide plate.

The present invention further relates to a backlight unit comprising at least one light source, a nanoplatelets formulation or film and a diffuser plate. In one embodiment (FIG. 15), the at least one light source illuminate under the nanoplatelets formulation or film, which illuminate in turn the diffuser plate.

The present invention further relates to a backlight unit comprising at least one encapsulated nanoplatelets light emitting device and a diffuser plate. In one embodiment (FIG. 16), the at least one encapsulated nanoplatelets light emitting device illuminate under the diffuser plate.

In one embodiment, the backlight unit may further comprise a light reflective material placed under the light guide plate.

The present invention also relates to a liquid crystal display unit comprising a backlight unit according to the invention and a liquid crystal display panel, preferably having a set of red, blue and green color filters.

The present invention also relates to a display device comprising a backlight unit according to the invention and a display panel, preferably having a set of red, blue and green color filters.

The present invention further relates to a display device comprising at least one pixel chip and an encapsulated nanoplatelets formulation or film according to the invention.

In one embodiment, the pixel chip has a size from 2 μm to 3, 4, 5, 6, 7, 8, 9, 10, 11, 12, 13, 14, 15, 16, 17, 18, 19, 20 μm.

The present invention further relates to a LED array or a micro Led array comprising an array of pixel chips and encapsulated nanoplatelets formulations or films according to the invention.

In one embodiment, the array of pixel chips has a size of 5×5 μm, 10×10 μm, 100×100 μm, or 1000×1000 μm pitch.

REFERENCES

Figure 1:
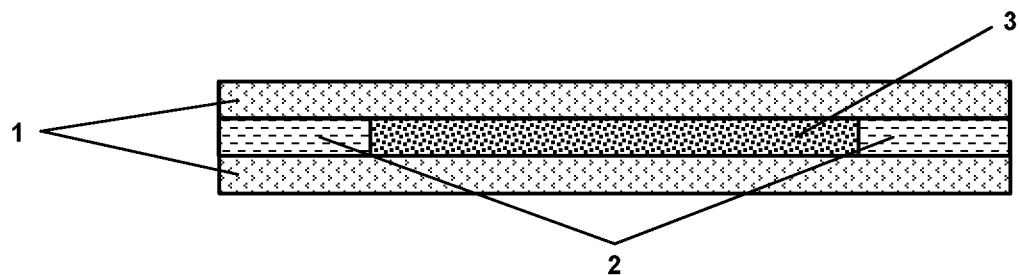
FIG. 1 shows a scheme of an encapsulated nanoplatelets formulation or film according to the present invention, wherein the nanoplatelets formulation or film is sandwiched by two protective layers on the bottom and on the top and surrounded by an auxiliary layer on the sides.
Figure 2:
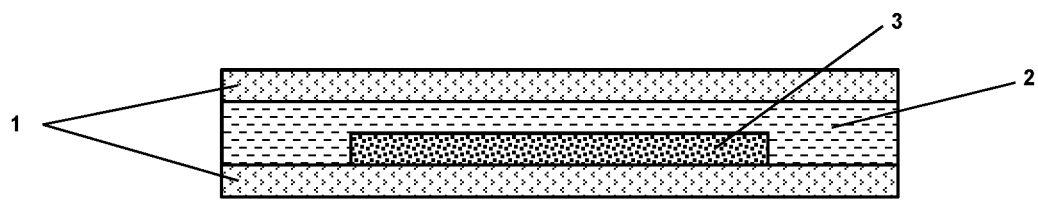
FIG. 2 shows a scheme of an encapsulated nanoplatelets formulation or film according to the present invention, wherein the nanoplatelets formulation or film is surrounded by a protective layer on the bottom and by an auxiliary layer on the top and on the sides. A second protective layer is present on the top of the auxiliary layer.
Figure 3:
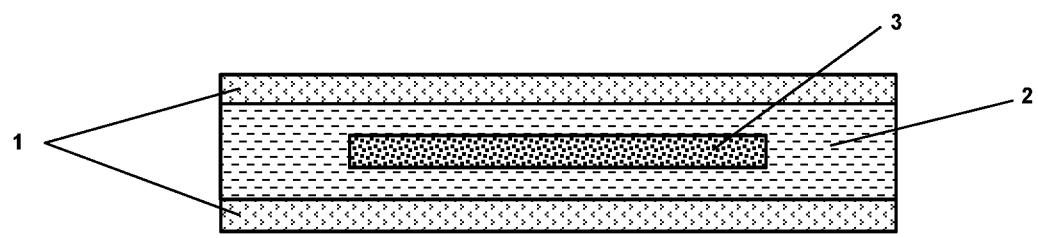
FIG. 3 shows a scheme of an encapsulated nanoplatelets formulation or film according to the present invention, wherein the nanoplatelets formulation or film is enclosed in an auxiliary layer which is sandwiched by two protective layers on the bottom and on the top.
Figure 4:
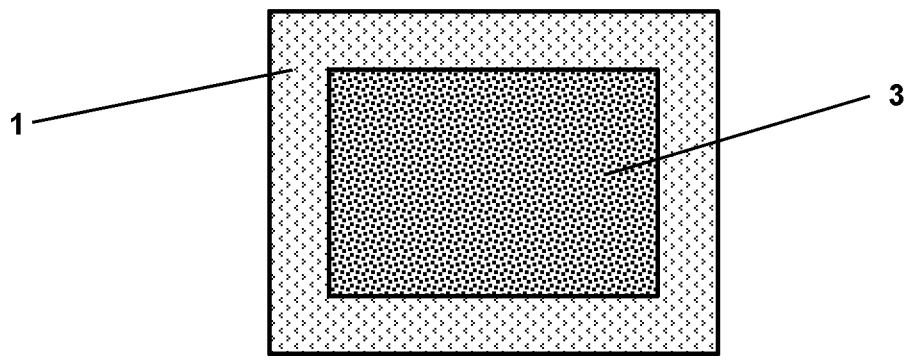
FIG. 4 shows a scheme of an encapsulated nanoplatelets formulation or film according to the present invention, wherein the nanoplatelets formulation or film is enclosed in a protective layer in form of a tube, a vessel or a capillary.
Figure 5:
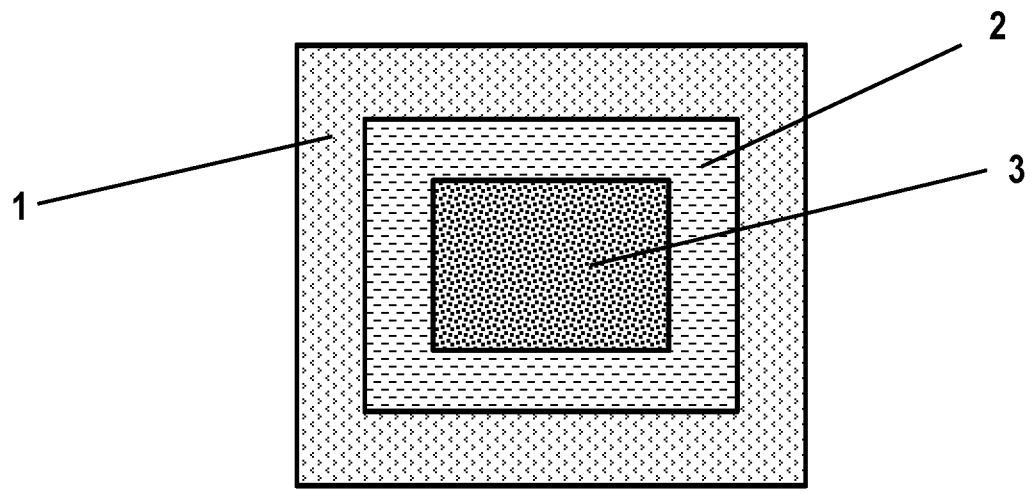
FIG. 5 shows a scheme of an encapsulated nanoplatelets formulation or film according to the present invention, wherein the nanoplatelets formulation or film is surrounded by an auxiliary layer which is enclosed in a protective layer in form of a tube, a vessel or a capillary.
Figure 6:
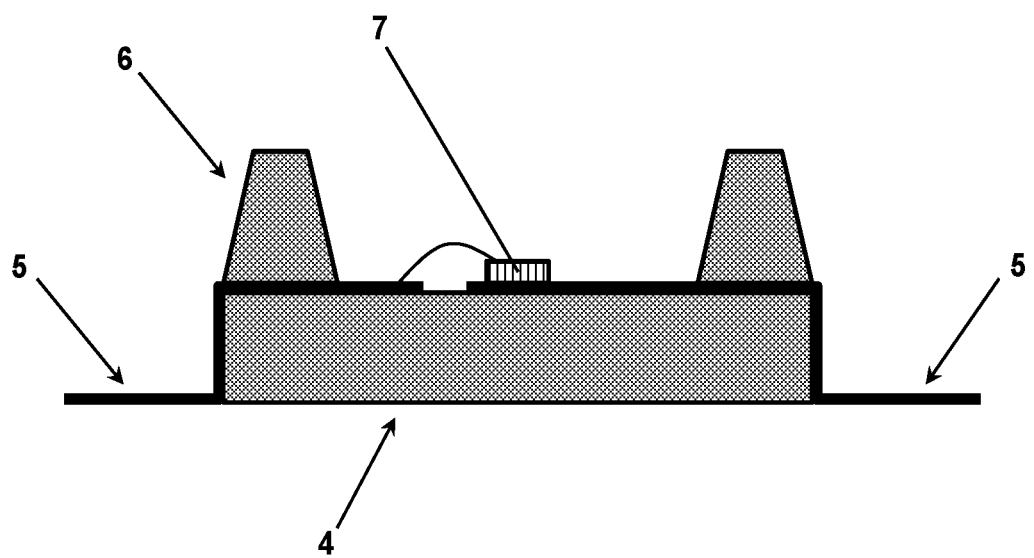
FIG. 6 shows a scheme of a LED.
Figure 7:
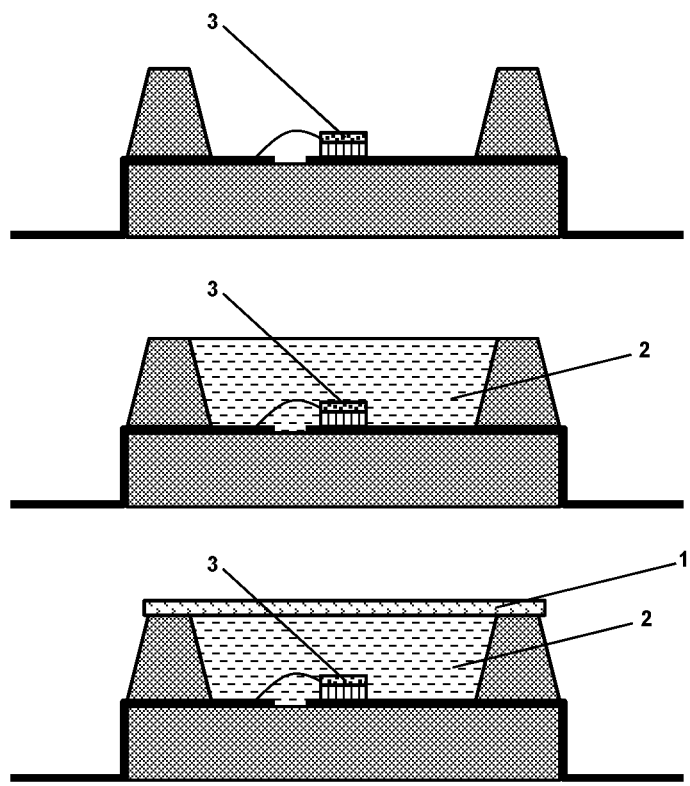
FIG. 7 shows a scheme of the construction of an encapsulated nanoplatelets light emitting device according to the present invention, where the nanoplatelets formulation or film is first deposed on top of the LED chip. Then, an auxiliary layer is added and enclosed the nanoplatelets formulation or film and the LED chip. Finally, a protective layer is deposed above the construction.
Figure 8:
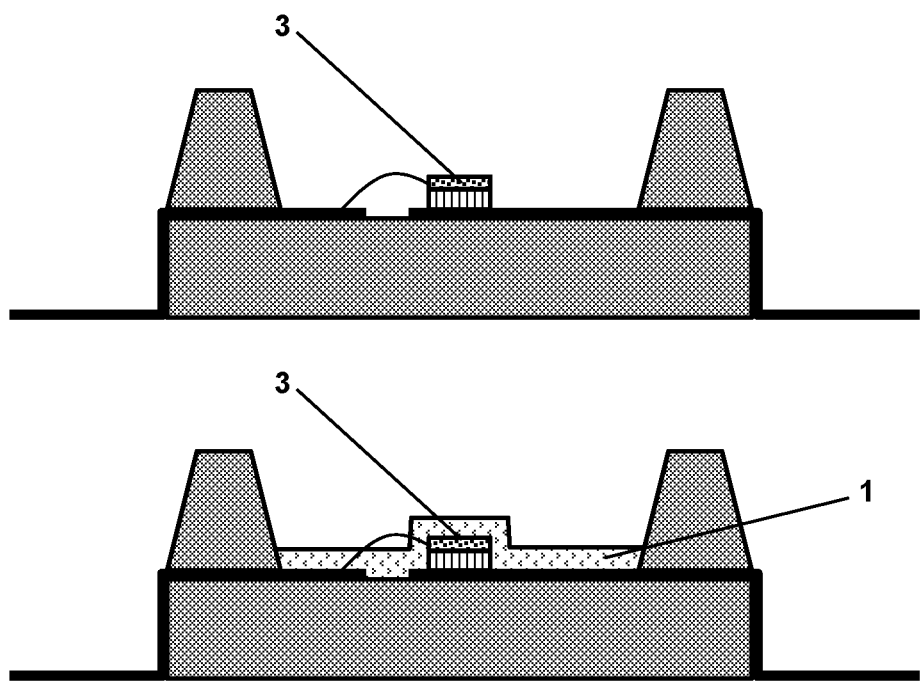
FIG. 8 shows a scheme of the construction of an encapsulated nanoplatelets light emitting device according to the present invention, where the nanoplatelets formulation or film is first deposed on top of the LED chip. Then, a protective layer is deposed so that it encloses the nanoplatelets formulation or film and the LED chip.
Figure 9:
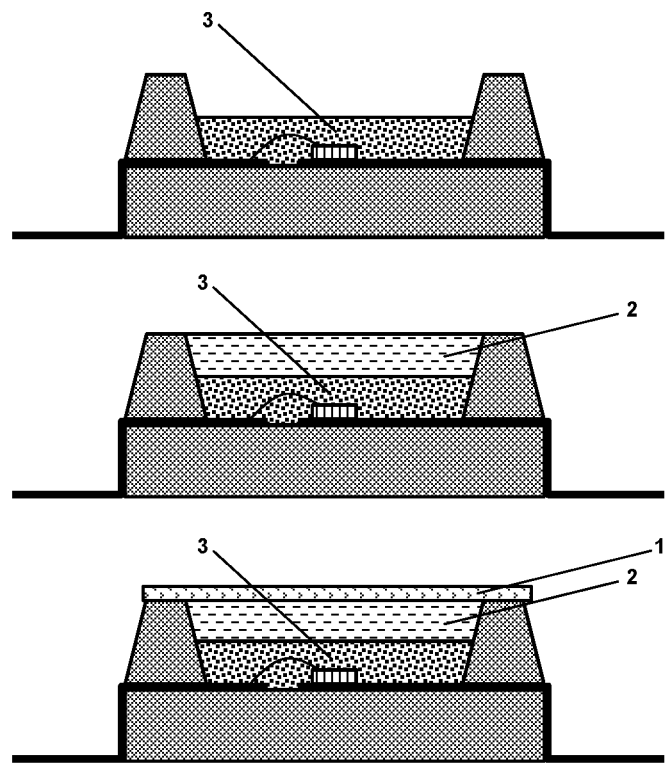
FIG. 9 shows a scheme of the construction of an encapsulated nanoplatelets light emitting device according to the present invention, where the nanoplatelets formulation or film is deposed so that it surrounds the LED chip. Then, an auxiliary layer is added on the nanoplatelets formulation or film. Finally, a protective layer is deposed above the construction.
Figure 10:
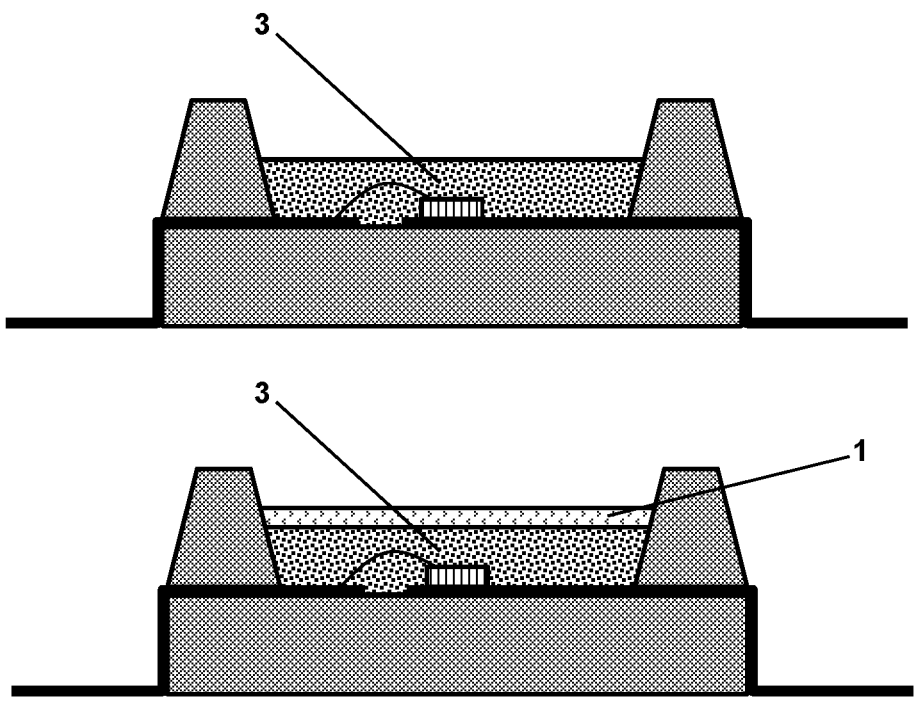
FIG. 10 shows a scheme of the construction of an encapsulated nanoplatelets light emitting device according to the present invention, where the nanoplatelets formulation or film is deposed so that it surrounds the LED chip. Then, a protective layer is deposed on the nanoplatelets formulation or film.
Figure 11:
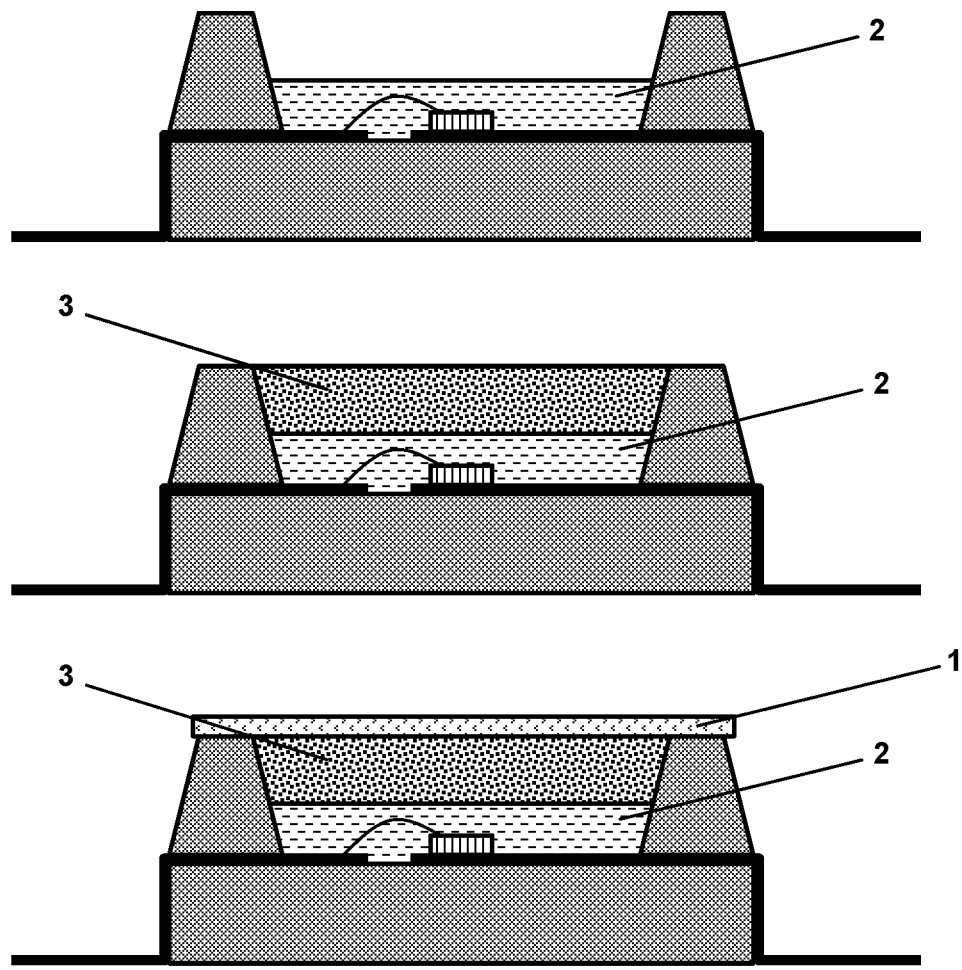
FIG. 11 shows a scheme of the construction of an encapsulated nanoplatelets light emitting device according to the present invention, where an auxiliary layer is deposed so that it surrounds the LED chip. Then, a nanoplatelets formulation or film is added on the auxiliary layer. Finally, a protective layer is deposed above the construction.
Figure 12:
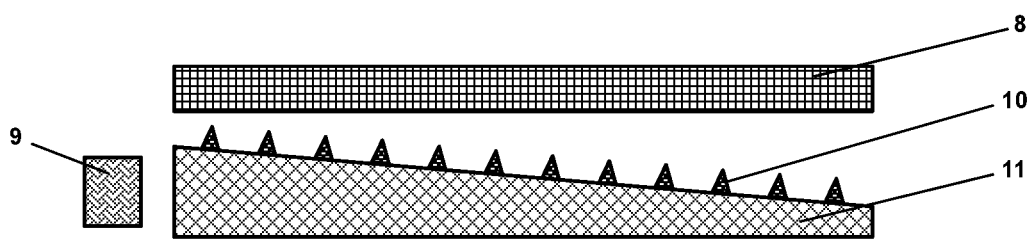
FIG. 12 shows a scheme of a backlight unit, wherein a light source illuminates, on the side, a light guide plate comprising light recycling elements. An encapsulated nanoplatelets formulation or film is present above the light guide plate.
Figure 13:
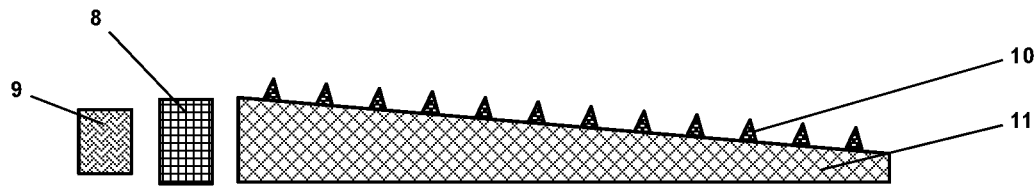
FIG. 13 shows a scheme of a backlight unit, wherein a light source illuminates, on the side, an encapsulated nanoplatelets formulation or film which lights, in his turn, on the side, a light guide plate comprising light recycling elements.
Figure 14:
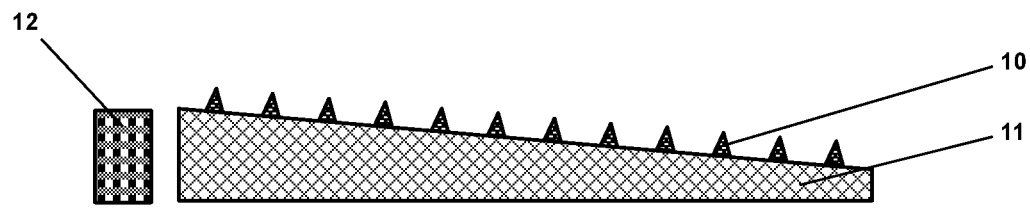
FIG. 14 shows a scheme of a backlight unit, wherein an encapsulated nanoplatelets light emitting device illuminates, on the side, a light guide plate comprising light recycling elements.
Figure 15:
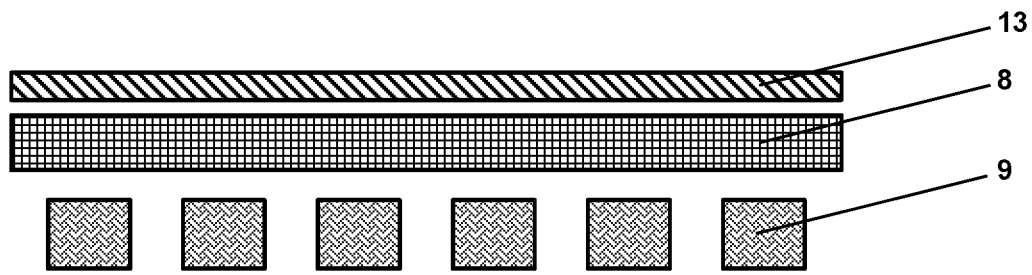
FIG. 15 shows a scheme of a backlight unit, wherein several light sources illuminate, under an encapsulated nanoplatelets formulation or film. A diffuser plate is present above the encapsulated nanoplatelets formulation or film.
Figure 16:
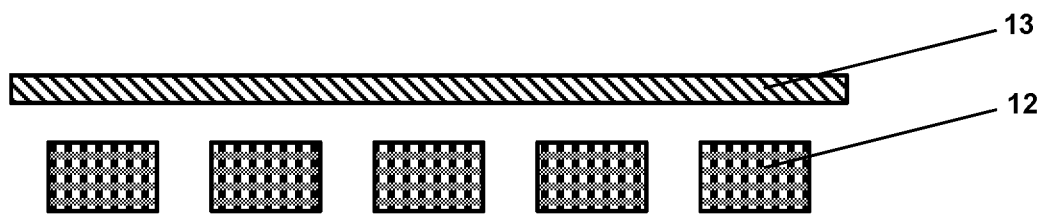
FIG. 16 shows a scheme of a backlight unit, wherein several encapsulated nanoplatelets light emitting devices illuminate under a diffuser plate.
Figure 17:
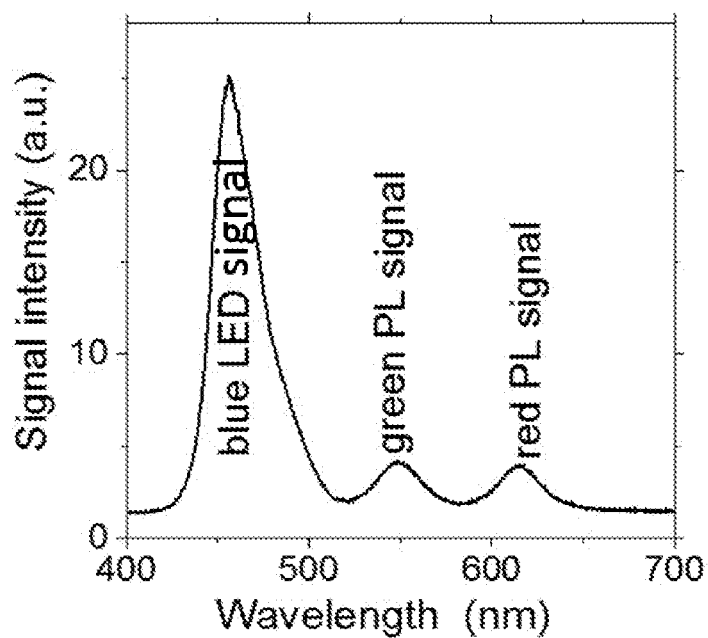
FIG. 17 shows the emission spectrum of a nanoplatelets formulation or film according to the present invention, including green and red nanoplatelets illuminated by a 455 nm blue diode.

1. Protective layer;
2. Auxiliary layer;
3. Nanoplatelets formulation or film;
4. LED support;
5. LED electrodes;
6. LED edges;
7. LED chip;
8. Encapsulated Nanoplatelets formulation or film;
9. Light source;
10. Light recycling element;
11. Light guide plate;
12. Encapsulated nanoplatelets light emitting device;
13. Diffuser plate.

EXAMPLES

Example 1

A solution of CdSe/CdZnS nanoplatelets is precipitated under regular atmosphere by addition of ethanol. After centrifugation, the performed pellet is redispersed in toluene solution. A 5 μL drop of this solution is deposited on a 13 mm diameter glass coverslip. Then, the substrate is entered in air free glove box. Meanwhile pellets of PET-g (Polyethylene terephthalate glycol-modified) are released from molecular water and molecular oxygen by heating at 150° C. for 4 hours under vacuum and then entered in the air free glovebox. On a second coverslip a pellet of PET-g is deposited and heated at 150° C. for 5 min. Then, the coverslip with the NPLs is superposed on the top of this second coverslip and slowly crushed to form a sandwich of coverslip-PETg-NPLs-coverslip. The layered material is then glued (on the NPLs surface) thanks to a PMMA solution dissolved in chloroform on a 455 nm LED from Osram.

Example 2

A solution of CdSe/CdZnS nanoplatelets is precipitated under regular atmosphere by addition of ethanol. After centrifugation, the performed pellet is redispersed in toluene. A 5 μL drop of this solution is deposited on a 13 mm diameter glass coverslip. Meanwhile pellets of PET-g (Polyethylene terephthalate glycol-modified) are deposited on a second coverslip and heated at 150° C. for 5 min. Then, the coverslip with the NPLs is superposed on the top of this second coverslip and slowly crushed to form a sandwich of coverslip-PETg-NPLs-coverslip. The layered material is then glued (on the NPLs surface) thanks to a PMMA solution dissolved in chloroform on a 455 nm LED from Osram.

Example 3

A solution of CdSe/CdZnS nanoplatelets is precipitated under regular atmosphere by addition of ethanol. After centrifugation, the performed pellet is entered in air free glovebox. Then, the performed pellet is redispersed in molecular oxygen- and molecular water-free toluene. Meanwhile, a solution of PMMA (Poly(methyl methacrylate), 120 k) at 10 wt % in molecular oxygen- and molecular water-free toluene is prepared. This solution is inerted by freeze-pumping-thawing the mixture three times successively using liquid nitrogen and entered in air free glovebox. Then the NPLs solution is mixed with the polymer solution in a 100:1 to 1:100/NPLs:PMMA volume ratio and the solution is further stirred. 5 μL of this mixed solution is deposited on a 13 mm diameter glass coverslip. The solution is let dried for 12 hours and then degassed under vacuum for 1 h. Then, the 2 components of a Stycast 1266 A/B epoxy encapsulant (Emerson & Cuming) is degazed for 1 h and entered in air free glovebox. The components of the epoxy are mixed in 33/100 A/B volume ratio. The coverslip with the NPLs in PMMA is then covered with a second coverslip and sealed with the epoxy mixture. The layered material islet dried for 24 hours in the air free glovebox. The layered material is then glued (on the NPLs/PMMA surface) thanks to a PMMA solution dissolved in chloroform on a 455 nm LED from Osram.

Example 4

A solution of CdSe/CdZnS nanoplatelets is precipitated under regular atmosphere by addition of ethanol. After centrifugation, the performed pellet is entered in air free glovebox. Then, the performed pellet is redispersed in molecular oxygen- and molecular water-free toluene. Meanwhile, a solution of PMMA (Poly(methyl methacrylate), 120 k) at 10 wt % in molecular oxygen- and molecular water-free toluene is prepared. This solution is inerted by freeze-pumping-thawing the mixture three times successively using liquid nitrogen and entered in air free glovebox. Then the NPLs solution is mixed with the polymer solution in a 100:1 to 1:100/NPLs:PMMA volume ratio and the solution is further stirred. 5 μL of this mixed solution is deposited on a 13 mm diameter glass coverslip. The solution is let dried for 24 hours and then degassed under vacuum for 12 h. Then, the substrate is covered by $Al_2O_3$ by Atom Layer Deposition (ALD). The layered material is then glued (on the coverslip surface) thanks to a PMMA solution dissolved in chloroform on a 455 nm LED from Osram.

Example 5

A solution of CdSe/CdZnS nanoplatelets is precipitated under regular atmosphere by addition of ethanol. After centrifugation, the performed pellet is entered in air free glovebox. Meanwhile, a solution of lauryl methacrylate (LMA) and another solution of ethylene glycol dimethacylate (EGDMA) are inerted by freeze-pumping-thawing the mixture three times successively using liquid nitrogen and entered in air free glovebox. The NPLs pellet is dispersed in lauryl methacrylate. A solution of different ratio of LMA and EGDMA with molecular oxygen and molecular water-free AIBN (Azobisisobutyronitrile) is prepared. The ratio of LMA to EGDMA varies from 100:1 to 1:5 and the ratio of monomers to AIBN varies from 10:1 to 10000:1. The monomer and initiator mixture is then mixed with the NPLs solution with a ratio of 100:1 to 1:5. 5 μL of this new mixture is deposited on a 13 mm diameter glass coverslip. The substrate is heated at 85° C. for 12 h to polymerize. Then, the substrate is covered by $Al_2O_3$ by Atom Layer Deposition (ALD). The layered material is then glued (on the coverslip_surface) thanks to a PMMA solution dissolved in chloroform on a 455 nm LED from Osram.

Example 6

A solution of CdSe/CdZnS nanoplatelets is precipitated under regular atmosphere by addition of ethanol. After centrifugation, the performed pellet is entered in air free glovebox. Meanwhile, a solution of butyl methacrylate (BuMA) and another solution of ethylene glycol dimethacylate (EGDMA) are inerted by freeze-pumping-thawing the mixture three times successively using liquid nitrogen and entered in air free glovebox. The NPLs pellet is dispersed in BuMA. A solution of different ratio of BuMA and EGDMA with molecular oxygen and molecular water-free AIBN (Azobisisobutyronitrile) is prepared. The ratio of BuMA to EGDMA varies from 100:1 to 1:5 and the ratio of monomers to AIBN varies from 10:1 to 10000:1. The monomer and initiator mixture is then mixed with the NPLs solution with a ratio of 100:1 to 1:5. 5 µL of this new mixture is deposited on a 13 mm diameter glass coverslip. The substrate is heated at 85° C. for 12 h to polymerize. Then, the substrate is covered by $Al_2O_3$ by Atom Layer Deposition (ALD). The layered material is then glued (on the coverslip surface) thanks to a PMMA solution dissolved in chloroform on a 455 nm LED from Osram.

Example 7

A solution of CdSe/CdZnS nanoplatelets is precipitated under regular atmosphere by addition of ethanol. After centrifugation, the performed pellet is entered in air free glovebox. Meanwhile, a solution of lauryl methacrylate (LMA) and another solution of ethylene glycol dimethacylate (EGDMA) are inerted by freeze-pumping-thawing the mixture three times successively using liquid nitrogen and entered in air free glovebox. The NPLs pellet is dispersed in lauryl methacrylate. A solution of different ratio of LMA and EGDMA with molecular oxygen and molecular water-free Irgacure 819 or benzophenone UV-initiator is prepared. The ratio of LMA to EGDMA varies from 100:1 to 1:5 and the ratio of monomers to UV-initiator varies from 10:1 to 10000:1. The monomer and initiator mixture is then mixed with the NPLs solution with a ratio of 100:1 to 1:5. 5 µL of this new mixture is deposited on a 13 mm diameter glass coverslip. The substrate is cured for 1 h under a UV lamp and the heated at 85° C. for 12 h to polymerize. Then, the substrate is covered by $Al_2O_3$ by Atom Layer Deposition (ALD). The layered material is then glued (on the coverslip surface) thanks to a PMMA solution dissolved in chloroform on a 455 nm LED from Osram.

Example 8

A solution of CdSe/CdZnS nanoplatelets is precipitated under regular atmosphere by addition of ethanol. After centrifugation, the performed pellet is entered in air free glovebox. Meanwhile, a solution of lauryl methacrylate (LMA) and another solution of ethylene glycol dimethacylate (EGDMA) are inerted by freeze-pumping-thawing the mixture three times successively using liquid nitrogen and entered in air free glovebox. The NPLs pellet is dispersed in lauryl methacrylate containing molecular oxygen and molecular water-free AIBN (Azobisisobutyronitrile). This solution is heated for 30 min at 85° C. to form a syrup-called solution. Meanwhile, a solution of different ratio of LMA and EGDMA with molecular oxygen and molecular water-free AIBN (Azobisisobutyronitrile) is prepared. The ratio of LMA to EGDMA varies from 100:1 to 1:5 and the ratio of monomers to AIBN varies from 10:1 to 10000:1. The monomer and initiator mixture is then mixed with the NPLs syrup with a ratio of 100:1 to 1:5. 5 µL of this new mixture is deposited on a on a 13 mm diameter glass coverslip. The substrate is heated at 85° C. for 12 h to polymerize. Then, the substrate is covered by $Al_2O_3$ by Atom Layer Deposition (ALD). The layered material is then glued (on the coverslip surface) thanks to a PMMA solution dissolved in chloroform on a 455 nm LED from Osram.

Example 9

A solution of CdSe/CdZnS nanoplatelets is precipitated under regular atmosphere by addition of ethanol. After centrifugation, the performed pellet is entered in air free glovebox. Then, the performed pellet is redispersed in molecular oxygen- and molecular water-free toluene. Meanwhile, a solution of PMMA (Poly(methyl methacrylate), 120 k) at 10 wt % in molecular oxygen- and molecular water-free toluene is prepared. This solution is inerted by freeze-pumping-thawing the mixture three times successively using liquid nitrogen and entered in air free glovebox. Then the NPLs solution is mixed with the polymer solution in a 100:1 to 1:100/NPLs:PMMA volume ratio and the solution is further stirred. 0.5 µL of this new mixture is directly deposited on the chip of a 455 nm Osram diode. The solution is let dried for 24 hours and then degassed under vacuum for 12 h. Then, the substrate is covered by $Al_2O_3$ by Atom Layer Deposition (ALD).

Example 10

A solution of CdSe/CdZnS nanoplatelets is precipitated under regular atmosphere by addition of ethanol. After centrifugation, the performed pellet is entered in air free glovebox. Meanwhile, a solution of lauryl methacrylate (LMA) and another solution of ethylene glycol dimethacylate (EGDMA) are inerted by freeze-pumping-thawing the mixture three times successively using liquid nitrogen and entered in air free glovebox. The NPLs pellet is dispersed in lauryl methacrylate containing molecular oxygen and molecular water-free AIBN (Azobisisobutyronitrile). This solution is heated for 30 min at 85° C. to form a syrup-called solution. Meanwhile, a solution of different ratio of LMA and EGDMA with molecular oxygen and molecular water-free AIBN (Azobisisobutyronitrile) is prepared. The ratio of LMA to EGDMA varies from 100:1 to 1:5 and the ratio of monomers to AIBN varies from 10:1 to 10000:1. The monomer and initiator mixture is then mixed with the NPLs syrup with a ratio of 100:1 to 1:5. 0.5 µL of this new mixture is directly deposited on the chip of a 455 nm Osram diode. The substrate is heated at 85° C. for 12 h to polymerize. Then, the substrate is covered by $Al_2O_3$ by Atom Layer Deposition (ALD).

Example 11

A solution of CdSe/CdZnS nanoplatelets is precipitated under regular atmosphere by addition of ethanol. After centrifugation, the performed pellet is redispersed in toluene solution. A 5 µL drop of this solution is deposited on a 13 mm diameter glass coverslip and entered in air free glove box. Then, the substrate is covered by $Al_2O_3$ by Atom Layer Deposition (ALD). The layered material is then glued (on the coverslip surface) thanks to a PMMA solution dissolved in chloroform on a 455 nm LED from Osram.

Example 12

A solution of CdSe/CdZnS nanoplatelets is precipitated under regular atmosphere by addition of ethanol. After centrifugation, the performed pellet is redispersed in toluene solution. A 0.5 µL drop of this solution is directly deposited on the GaN crystal of a 455 nm Osram diode and entered in air free glove box. Then, the substrate is covered by $Al_2O_3$ by Atom Layer Deposition (ALD).

Example 13

A solution of CdSe/CdZnS nanoplatelets encapsulated in silica particles is precipitated under regular atmosphere by addition of acetone. After centrifugation, the performed pellet is redispersed in toluene solution. A 0.5 µL drop of this solution is directly deposited on the GaN crystal of a 455 nm Osram diode.

Example 14

0.5 µL of a solution of CdSe/CdZnS nanoplatelets encapsulated in particles made of PMMA (Poly(lauryl methacrylate) are deposited on the GaN crystal of a 455 nm Osram diode and entered in air free glove box. Then, the substrate is covered by $Al_2O_3$ by Atom Layer Deposition (ALD).

Measurement of the Normalized Fluorescence Quantum Efficiency

Figure 18:
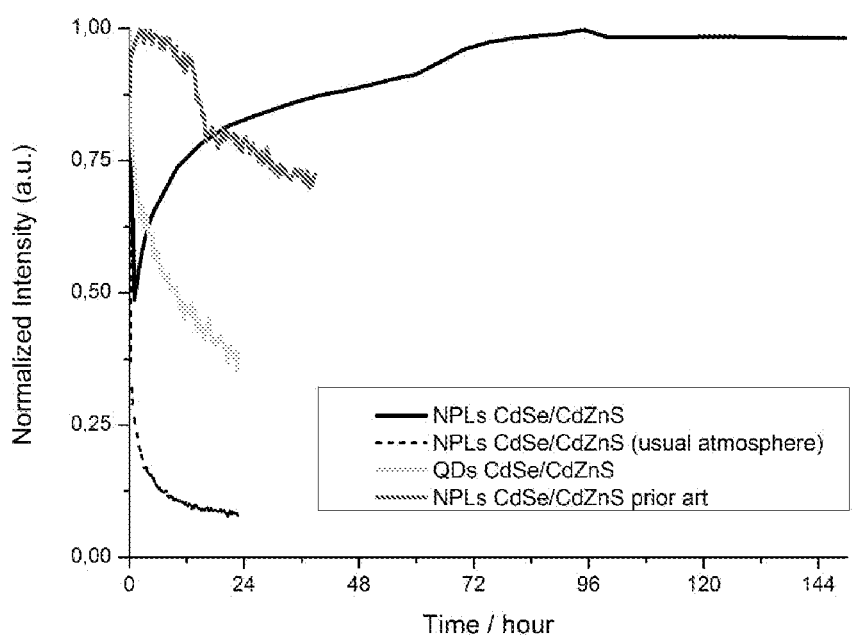
FIG. 18 shows the measurement of the normalized fluorescence quantum efficiency coming from an encapsulated nanoplatelets formulation or film of CdSe/CdZnS nanoplatelets according to the present invention, from an encapsulated nanoplatelets formulation or film of CdSe/CdZnS nanoplatelets of prior art, from an encapsulated nanoplatelets formulation or film of CdSe/CdZnS quantum dots according to prior art and from an CdSe/CdZnS nanoplatelets formulation or film made under normal molecular oxygen and molecular water conditions, illuminated by a 455 nm LED operating at 350 mA corresponding to a photon flux of 30 W·cm$^{-2}$. The encapsulated nanoplatelets formulation or film of CdSe/CdZnS nanoplatelets according to the present invention exhibits a much lower decrease of fluorescence quantum efficiency over 48 hours than the other materials.
Figure 19:
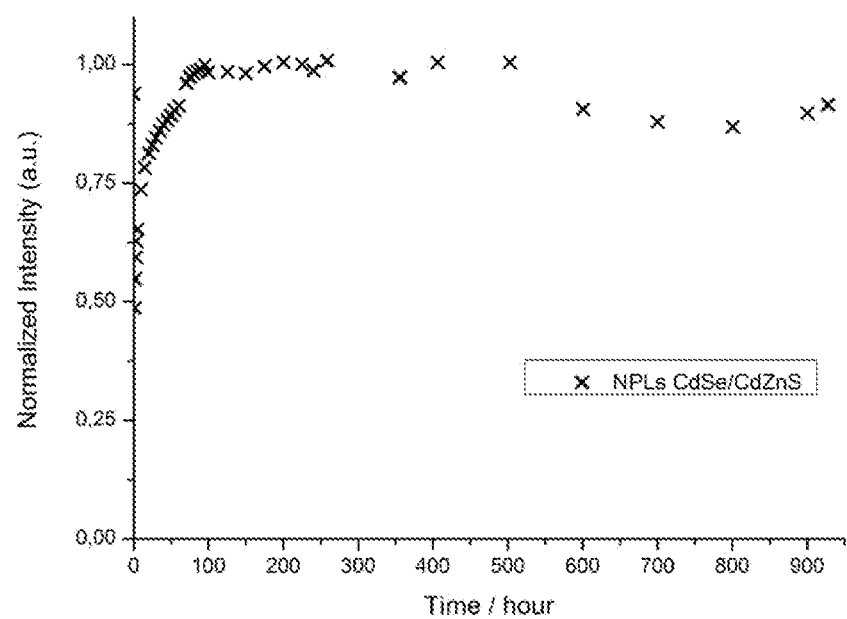
FIG. 19 shows the measurement of the normalized fluorescence quantum efficiency coming from an encapsulated nanoplatelets formulation or film of CdSe/CdZnS nanoplatelets according to the present invention, illuminated by a 455 nm LED operating at 350 mA corresponding to a photon flux of 30 W·cm$^{-2}$.

The encapsulated nanoplatelets as described above are excited using the LED operating under a constant currant of 350 mA corresponding to an illumination with a photon flux of 30 W·cm$^{-2}$. The fluorescence of the encapsulated material as well as a fraction of the blue light from the LED is acquired using an optical fiber spectrometer (Ocean Optics STS-VIS). The stability of the fluorescence over time is obtained by normalizing the integrated fluorescence from the encapsulated material by the integrated fluorescence from the blue LED. This fluorescence quantum efficiency is then normalized to the maximum value of intensity and plotted over time for direct comparisons purposes (FIG. 18 and FIG. 19).

Nanoplatelets Cores Preparations

Synthesis of CdSe 460 Nanoplatelets (NPLs)

240 mg of Cadmium acetate (Cd(OAc)$_2$) (0.9 mmol), 31 mg of Se 100 mesh, 150 µL oleic acid (OA) and 15 mL of 1-octadecene (ODE) are introduced in a three neck flask and are degassed under vacuum. The mixture is heated under argon flow at 180° C. for 30 min.

Synthesis of CdSe 510 NPLs 170 mg of cadmium myristate (Cd(myr)$_2$) (0.3 mmol), 12 mg of Se 100 mesh and 15 mL of ODE are introduced in a three neck flask and are degassed under vacuum. The mixture is heated under argon flow at 240° C., when the temperature reaches 195° C., 40 mg of Cd(OAc)$_2$ (0.15 mmol) are introduced. The mixture is heated for 10 minutes at 240° C.

Synthesis of CdSe 550 NPLs 170 mg of Cd(myr)$_2$ (0.3 mmol) and 15 mL of ODE are introduced in a three neck flask and are degassed under vacuum. The mixture is heated under argon flow at 250° C. and 1 mL of a dispersion of Se 100 mesh sonicated in ODE (0,1M) are quickly injected. After 30 seconds, 80 mg of Cd(OAc)$_2$ (0.3 mmol) are introduced. The mixture is heated for 10 minutes at 250° C.

Synthesis of CdTe 428 NPLs

A three neck flask is charged with 130 mg of cadmium proprionate (Cd(prop)$_2$) (0.5 mmol), 80 µL of OA (0.25 mmol), and 10 mL of ODE, and the mixture is stirred and degassed under vacuum at 95° C. for 2 h. The mixture under argon is heated at 180° C. and 100 µL of a solution of 1 M Te dissolved in trioctylphosphine (TOP-Te) diluted in 0.5 mL of ODE are swiftly added. The reaction is heated for 20 min at the same temperature.

When 428 NPLs are prepared using Cd(OAc)$_2$, TOP-Te 1 M is injected between 120 and 140° C.

Synthesis of CdTe 500 NPLs

A three-neck flask is charged with 130 mg of Cd(prop)$_2$ (0.5 mmol), 80 µL of OA (0.25 mmol), and 10 mL of ODE, and the mixture is stirred and degassed under vacuum at 95° C. for 2 h. The mixture under argon is heated at 210° C., and 100 µL of a solution of 1 M TOP-Te diluted in 0.5 mL of ODE is swiftly added. The reaction is heated for 30 min at the same temperature.

When Cd(OAc)2 was used as cadmium precursor, TOP-Te is injected between 170 and 190° C.

Synthesis of CdTe 556 NPLs 133 mg of Cd(OAc)$_2$ (0.5 mmol), 255 µL of OA (0.8 mmol), and 25 mL of ODE are charged into a three-neck flask, and the mixture is stirred and degassed under vacuum at 95° C. for 2 h. The flask is filled with argon and the temperature is increased to 215° C. Then, 0.05 mmol of stoichiometric TOP-Te (2.24 M) diluted in 2.5 mL ODE is injected with a syringe pump at a constant rate over 15 min. When the addition is completed, the reaction is heated for 15 min.

Synthesis of CdS 375 NPLs

In a three neck flask 160 mg of Cd(OAc)$_2$ (0.6 mmol), 190 µL (0.6 mmol) of OA, 1.5 mL of sulfur dissolved in 1-octadecene (S-ODE) 0.1 M and 13.5 mL of ODE are introduced and degassed under vacuum for 30 minutes. Then the mixture is heated at 180° C. under Argon flow for 30 minutes.

Synthesis of CdS 407 NPLs

In a three neck flask 160 mg of Cd(OAc)$_2$ (0.6 mmol), 190 µL (0.6 mmol) of OA, 1.5 mL of S-ODE 0.1 M and 13.5 mL of octadecene are introduced and degassed under vacuum for 30 minutes. Then the mixture is heated at 260° C. under Argon flow for 1 minute.

Synthesis of Core/Crown CdSe/CdS NPLs

In a three neck flask, 320 mg of Cd(OAc)$_2$ (1.2 mmol), 380 µL of OA (1.51 mmol) and 8 mL of octadecene are degassed under vacuum at 65° C. for 30 minutes. Then CdSe nanoplatelets cores in 4 mL of ODE are introduced under Argon. The reaction is heated at 210° C. and 0.3 mmol of S-ODE 0.05 M are added drop wise. After injection, the reaction is heated at 210° C. for 10 minutes.

Synthesis of Core/Crown CdSe/CdTe NPLs

In a three neck flask, CdSe nanoplatelets cores in 6 mL of ODE are introduced with 238 µL of OA (0.75 mmol) and 130 mg of Cd(prop)$_2$. The mixture is degassed under vacuum for 30 minutes then, under argon, the reaction is heated at 235° C. and 50 µL of TOP-Te 1M in 1 mL of ODE is added drop wise. After the addition, the reaction is heated at 235° C. for 15 minutes.

Synthesis of CdSeS Alloyed NPLs 170 mg of Cd(myr)$_2$ (0.3 mmol) and 15 mL of ODE are introduced in a three neck flask and are degassed under vacuum. The mixture is heated under argon flow at 250° C. and 1 mL of a dispersion of Se 100 mesh sonicated in S-ODE and ODE (total concentration of selenium and sulfur 0,1 M) are quickly injected. After 30 seconds, 120 mg of Cd(OAc)$_2$ (0.45 mmol) are introduced. The mixture is heated for 10 minutes at 250° C.

Shells Growth

CdS Shell Growth with Octanethiol

In a three neck flask, 15 mL of trioctylamine (TOA) are introduced and degassed under vacuum at 100° C. Then the reaction mixture is heated at 300° C. under Argon and 5 mL of core nanoplatelets in ODE are swiftly injected followed by the injection of 7 mL of 0.1 M octanethiol solution in ODE and 7 mL of 0.1M Cd(OA)$_2$ in ODE with syringe pumps at a constant rate over 90 min. After the addition, the reaction is heated at 300° C. for 90 minutes.

CdS Shell Growth with Octanethiol on Core-Shell Nanoplatelets

In a three neck flask, 15 mL of trioctylamine (TOA) are introduced and degassed under vacuum at 100° C. Then the reaction mixture is heated at 300° C. under Argon and 5 mL of core-shell nanoplatelets CdSe/CdZnS in ODE are swiftly injected followed by the injection of 7 mL of 0.1 M octanethiol solution in ODE and 7 mL of 0.1M Cd(OA)$_2$ in ODE with syringe pumps at a constant rate over 90 min. After the addition, the reaction is heated at 300° C. for 90 minutes.

CdS Shell Growth with Butanethiol

In a three neck flask, 15 mL of trioctylamine (TOA) are introduced and degassed under vacuum at 100° C. Then the reaction mixture is heated at 300° C. under Argon and 5 mL of core nanoplatelets in ODE are swiftly injected followed by the injection of 7 mL of 0.1 M butanethiol solution in ODE and 7 mL of 0.1M Cd(OA)$_2$ in ODE with syringe pumps at a constant rate over 90 min. After the addition, the reaction is heated at 300° C. for 90 minutes.

ZnS Shell Growth with Octanethiol

In a three neck flask, 15 mL of trioctylamine are introduced and degassed under vacuum at 100° C. Then the reaction mixture is heated at 300° C. under Argon and 5 mL of core nanoplatelets in octadecene are swiftly injected followed by the injection of 7 mL of 0.1 M octanethiol solution in octadecene and 7 mL of 0.1M zinc oleate (Zn(OA)$_2$) in octadecene with syringe pumps at a constant rate over 90 min. After the addition, the reaction is heated at 300° C. for 90 minutes.

ZnS Shell Growth with Butanethiol

In a three neck flask, 15 mL of trioctylamine are introduced and degassed under vacuum at 100° C. Then the reaction mixture is heated at 300° C. under Argon and 5 mL of core nanoplatelets in octadecene are swiftly injected followed by the injection of 7 mL of 0.1 M butanethiol solution in octadecene and 7 mL of 0.1M zinc oleate (Zn(OA)$_2$) in octadecene with syringe pumps at a constant rate over 90 min. After the addition, the reaction is heated at 300° C. for 90 minutes.

ZnS Shell Growth with Butanethiol on Core-Shell Nanoplatelets

In a three neck flask, 15 mL of trioctylamine are introduced and degassed under vacuum at 100° C. Then the reaction mixture is heated at 300° C. under Argon and 5 mL of core-shell nanoplatelets CdSe/CdS in octadecene are swiftly injected followed by the injection of 7 mL of 0.1 M butanethiol solution in octadecene and 7 mL of 0.1 M zinc oleate (Zn(OA)$_2$) in octadecene with syringe pumps at a constant rate over 90 min. After the addition, the reaction is heated at 300° C. for 90 minutes.

CdZnS Gradient Shell Growth with Octanethiol

In a three neck flask, 15 mL of trioctylamine are introduced and degassed under vaccum at 100° C. Then the reaction mixture is heated at 300° C. under Argon and 5 mL of core nanoplatelets in octadecene are swiftly injected followed by the injection of 7 mL of 0.1 M octanethiol solution in octadecene with syringe pumps at a constant rate and 3.5 mL of 0.1M Cd(OA)$_2$ in octadecene and 3.5 mL of 0.1M Zn(OA)$_2$ in octadecene with syringe pumps at variables rates over 90 min. After the addition, the reaction is heated at 300° C. for 90 minutes.

CdZnS Gradient Shell Growth with Butanethiol

In a three neck flask, 15 mL of trioctylamine are introduced and degassed under vaccum at 100° C. Then the reaction mixture is heated at 300° C. under Argon and 5 mL of core nanoplatelets in octadecene are swiftly injected followed by the injection of 7 mL of 0.1 M butanethiol solution in octadecene with syringe pumps at a constant rate and 3.5 mL of 0.1M Cd(OA)$_2$ in octadecene and 3.5 mL of 0.1M Zn(OA)$_2$ in octadecene with syringe pumps at variables rates over 90 min. After the addition, the reaction is heated at 300° C. for 90 minutes.

Cd$_x$Zn$_{1-x}$S Alloys Shell Growth with Octanethiol

In a three neck flask, 15 mL of trioctylamine are introduced and degassed under vaccum at 100° C. Then the reaction mixture is heated at 300° C. under Argon and 5 mL of core nanoplatelets in octadecene are swiftly injected followed by the injection of 7 mL of 0.1 M octanethiol solution in octadecene, (x)*3.5 mL of 0.1M Cd(OA)$_2$ in octadecene and (1−x)*3.5 mL of 0.1M Zn(OA)$_2$ in octadecene with syringe pumps at a constant rate over 90 min. After the addition, the reaction is heated at 300° C. for 90 minutes.

Cd$_x$Zn$_{1-x}$S Alloys Shell Growth with Butanethiol

In a three neck flask, 15 mL of trioctylamine are introduced and degassed under vaccum at 100° C. Then the reaction mixture is heated at 300° C. under Argon and 5 mL of core nanoplatelets in octadecene are swiftly injected followed by the injection of 7 mL of 0.1 M butanethiol solution in octadecene, (x)*3.5 mL of 0.1M Cd(OA)$_2$ in octadecene and (1−x)*3.5 mL of 0.1M Zn(OA)$_2$ in octadecene with syringe pumps at a constant rate over 90 min. After the addition, the reaction is heated at 300° C. for 90 minutes.

CdZnS Shell Growth with Butanethiol on Core-Shell Nanoplatelets

In a three neck flask, 15 mL of trioctylamine are introduced and degassed under vaccum at 100° C. Then the reaction mixture is heated at 300° C. under Argon and 5 mL of core-shell nanoplatelets CdSe/ZnS in octadecene are swiftly injected followed by the injection of 7 mL of 0.1 M butanethiol solution in octadecene, (x)*3.5 mL of 0.1M Cd(OA)$_2$ in octadecene and (1−x)*3.5 mL of 0.1M Zn(OA)$_2$ in octadecene with syringe pumps at a constant rate over 90 min. After the addition, the reaction is heated at 300° C. for 90 minutes.

CdZnS Shell Growth (Manufactured According to the Prior Art: Ambient Temperature Mahler et al. JACS. 2012, 134 (45), 18591-18598)

1 mL of CdSe 510 NPLs in hexane is diluted in 4 mL of chloroform, then 100 mg of thioacetamide (TAA) and 1 mL of octylamine are added in the flask and the mixture is sonicated until complete dissolution of the TAA (about 5 min). The color of the solution changed from yellow to orange during this time. 350 µL of a solution of Cd(NO3)2 0.2 M in ethanol and 150 µL of a solution of Zn(NO3)2 0.2 M in ethanol are then added to the flask. The reaction was allowed to proceed for 2 h at 65° C. After synthesis, the core-shell platelets were isolated from the secondary nucleation by precipitation with a few drops of ethanol and suspended in 5 mL of chloroform. Then 100 µL of Zn(NO3)2 0.2 M in ethanol is added to the nanoplatelets solution. They aggregate steadily and are resuspended by adding 200 µL oleic acid.

ZnS Alternative Shell Growth

In a three neck flask, 15 mL of trioctylamine are introduced and degassed under vacuum at 100° C. Then the reaction mixture is heated at 310° C. under Argon and 5 mL of core nanoplatelets in octadecene mixed with 50 µL of precursors mixture are swiftly injected followed by the injection of 2 mL of 0.1M zinc oleate $(Zn(OA)_2)$ and octanethiol solution in octadecene with syringe pump at a constant rate over 80 min.

The invention claimed is:

1. A formulation of semiconductor nanoplatelets comprising at least one nanoplatelet comprising a nanoplatelet core including a first semiconductor material and a shell including a second semiconductor material on the surface of the nanoplatelet core, wherein molecular oxygen is present in said formulation in an amount of less than about 10 ppm and/or molecular water is present in said formulation in an amount of less than about 100 ppm, and wherein the nanoplatelets formulation further comprises a host material being an inorganic material comprising $Al_2O_3$, $SiO_2$, $ZrO_2$, or $TiO_2$, zeolites, SiC, or a mixture thereof, wherein said host material is not glass.

2. The nanoplatelets formulation according to claim 1 further comprising scattering elements dispersed in the host material.

3. A nanoplatelets film obtained from the nanoplatelets formulation according to claim 1.

4. An encapsulated nanoplatelets film comprising the nanoplatelets film according to claim 3, and at least one protective layer.

5. The encapsulated nanoplatelets film according to claim 4, wherein the at least one protective layer can be made of glass, PET (Polyethylene terephthalate), PDMS (Polydimethylsiloxane), PES (Polyethersulfone), PEN (Polyethylene naphthalate), PC (Polycarbonate), PP (Polypropylene), PI (Polyimide), PNB (Polynorbornene), PAR (Polyarylate), PEEK (Polyetheretherketone), PCO (Polycyclic olefins), PVDC (Polyvinylidene chloride), Nylon, ITO (Indium tin oxide), FTO (Fluorine doped tin oxide), cellulose, $Al_2O_3$, $SiO_2$, SiC, $ZrO_2$, $TiO_2$, ceramic, organic modified ceramic and mixture thereof.

6. The encapsulated nanoplatelets film according to claim 4 being in the form of a tube, vessel, capillary, or a film.

7. The encapsulated nanoplatelets film of claim 4, further comprising at least one auxiliary layer.

8. An encapsulated nanoplatelets light emitting device comprising the encapsulated nanoplatelets film according to claim 4 and a LED.

9. A lighting device comprising the encapsulated nanoplatelets light emitting device according to claim 8.

10. A backlight unit comprising the encapsulated nanoplatelets film according to claim 4, at least one light source and a light guide plate.

11. Liquid crystal display unit or a display unit comprising a backlight unit according to claim 10.

12. A display device comprising at least one pixel chip and an encapsulated nanoplatelets film according to claim 4.

\* \* \* \* \*